United States Patent
Houis

(10) Patent No.: US 11,740,263 B2
(45) Date of Patent: Aug. 29, 2023

(54) CURRENT SENSOR SYSTEM

(71) Applicant: Melexis Technologies SA, Bevaix (CH)

(72) Inventor: Simon Houis, Bevaix (CH)

(73) Assignee: MELEXIS TECHNOLOGIES SA, Bevaix (CH)

(*) Notice: Subject to any disclaimer, the term of this patent is extended or adjusted under 35 U.S.C. 154(b) by 56 days.

(21) Appl. No.: 17/331,238

(22) Filed: May 26, 2021

(65) Prior Publication Data

US 2021/0373050 A1  Dec. 2, 2021

(30) Foreign Application Priority Data

Jun. 2, 2020  (EP) ..................................... 20177775
Apr. 17, 2021  (EP) ..................................... 21169032

(51) Int. Cl.
*G01R 19/00* (2006.01)
*G01R 15/20* (2006.01)

(52) U.S. Cl.
CPC ....... *G01R 19/0092* (2013.01); *G01R 15/202* (2013.01); *G01R 15/205* (2013.01); *G01R 15/207* (2013.01)

(58) Field of Classification Search
CPC .......................... G01R 19/0092; G01R 15/202; G01R 15/205; G01R 15/207
See application file for complete search history.

(56) References Cited

U.S. PATENT DOCUMENTS

| | | | |
|---|---|---|---|
| 2011/0221429 A1* | 9/2011 | Tamura | ................ G01R 15/207 324/244 |
| 2016/0223699 A1* | 8/2016 | Peczalski | ............. G01R 15/205 |
| 2018/0059148 A1* | 3/2018 | Geisler | ................ G01R 15/202 |
| 2020/0158760 A1* | 5/2020 | Fukuhara | ............. G01R 15/207 |
| 2020/0191835 A1 | 6/2020 | Bilbao De Mendizabal et al. | |

FOREIGN PATENT DOCUMENTS

| | | |
|---|---|---|
| DE | 202019106894 U1 | 3/2020 |
| EP | 3109658 A1 | 12/2016 |
| WO | 2012029439 A1 | 3/2012 |
| WO | 2015133621 A1 | 9/2015 |

OTHER PUBLICATIONS

Extended Search Report from corresponding EP Application No. EP20177775.2, dated Nov. 20, 2020.
Schneider et al., "Integrating Giant Magneto-Resistive (GMR) Field Detectors for High-Bandwidth Current Sensing in Power Electronic Modules," IEEE, Energy Conversion Congress and Exposition (ECCE), Sep. 12, 2010, pp. 1260-1267.

\* cited by examiner

*Primary Examiner* — Dominic E Hawkins
(74) *Attorney, Agent, or Firm* — Workman Nydegger

(57) ABSTRACT

A current sensor system for measuring an AC electrical current, comprising: a busbar having a thickness and a width; a sensor device comprising two sensor elements spaced apart along a first direction for measuring two magnetic field components oriented in a second direction; the sensor device configured for determining a magnetic field difference, and for determining the AC current based on said difference. The sensor device is positioned relative to the busbar such that a reference point in the middle between the two sensor elements is located at a first distance from a side of the busbar from 70% to 110% or from 70% to 95% of the width of the busbar and is located at a second distance from 0.5 to 4.0 mm from the busbar.

19 Claims, 20 Drawing Sheets

Fig. 1(a)
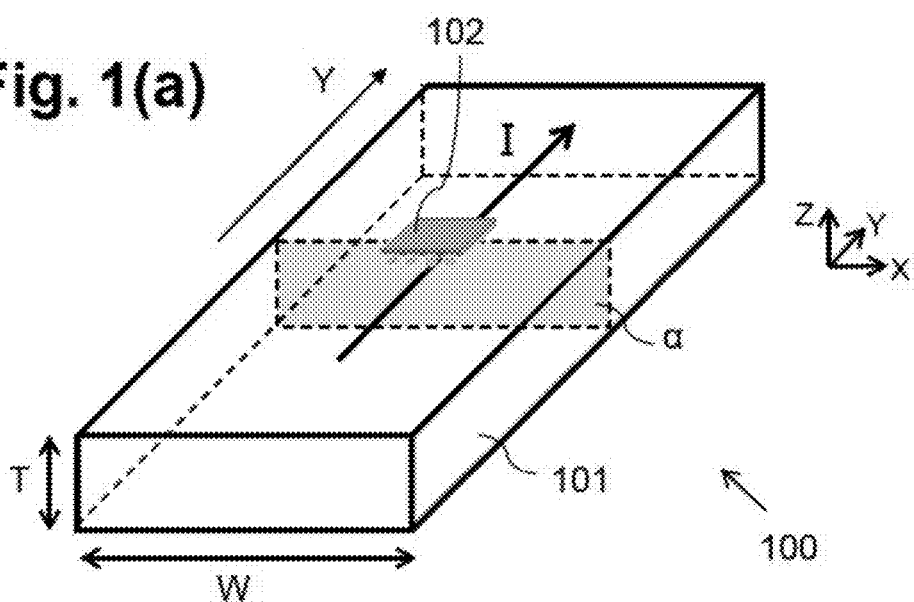
Fig. 1(b)
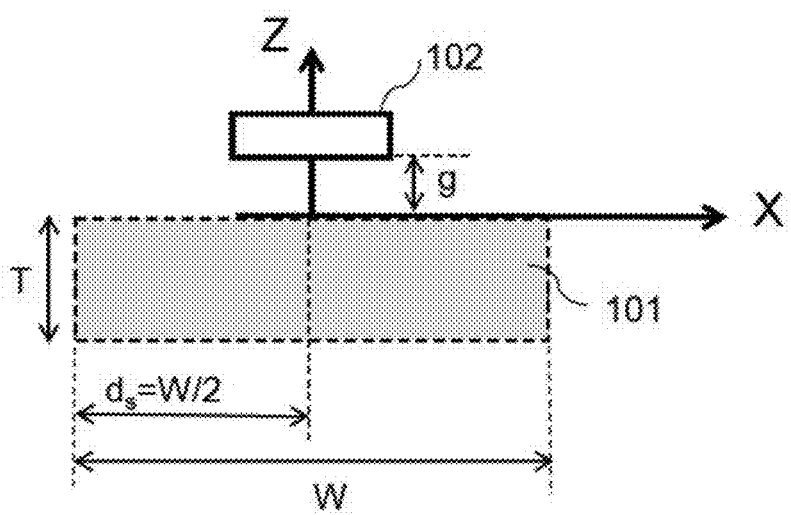
Fig. 1(c)
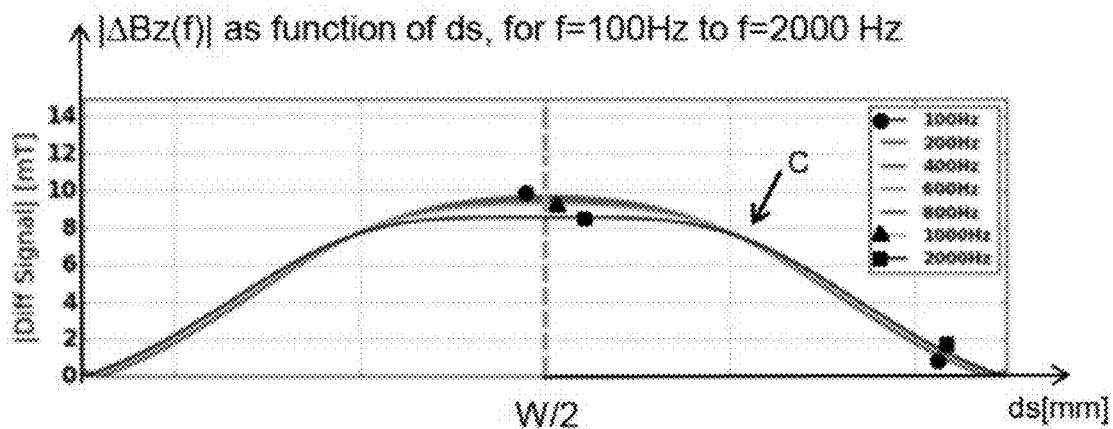
FIG 1

Fig. 2(a)
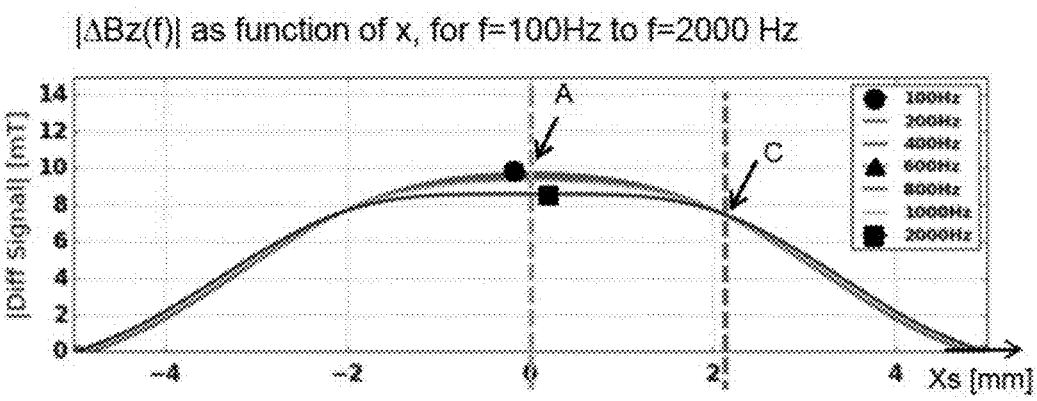
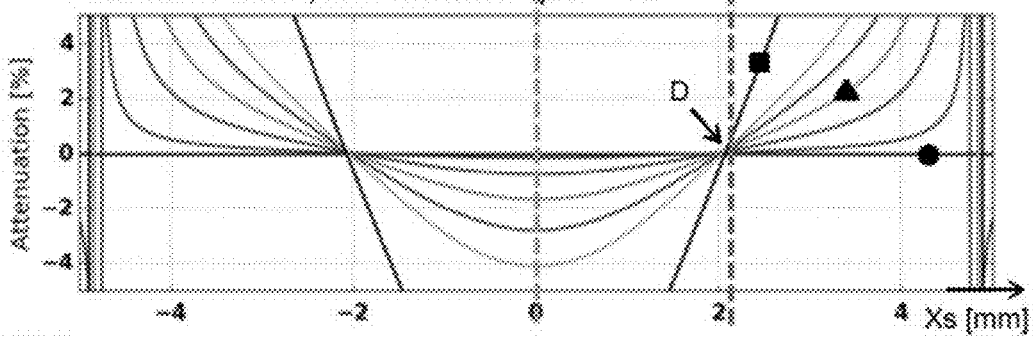
Fig. 2(b)
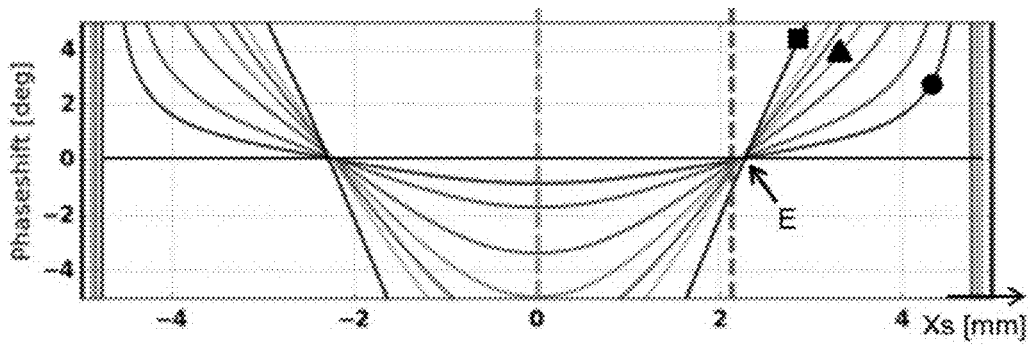
Fig. 2(c)
FIG 2

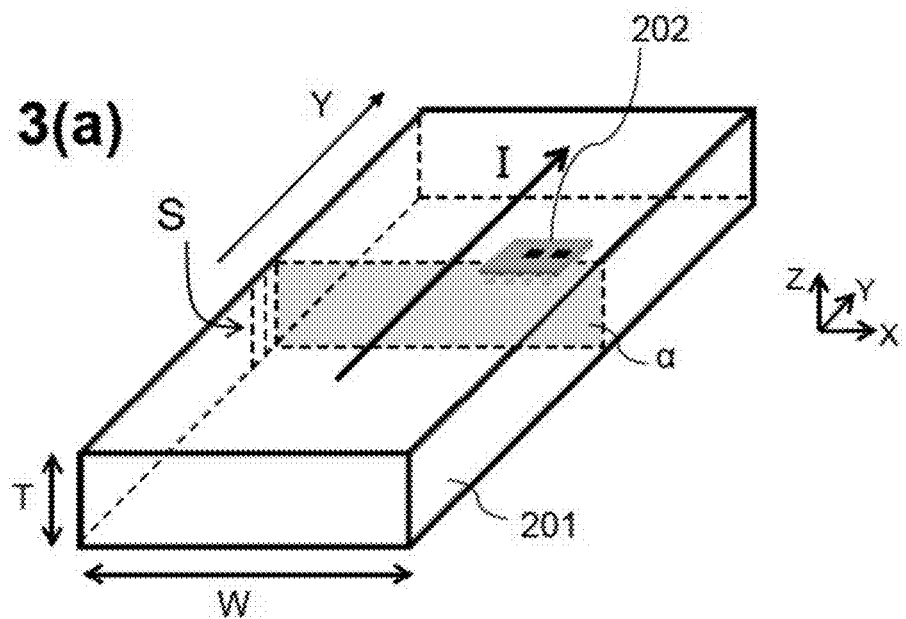
Fig. 3(a)
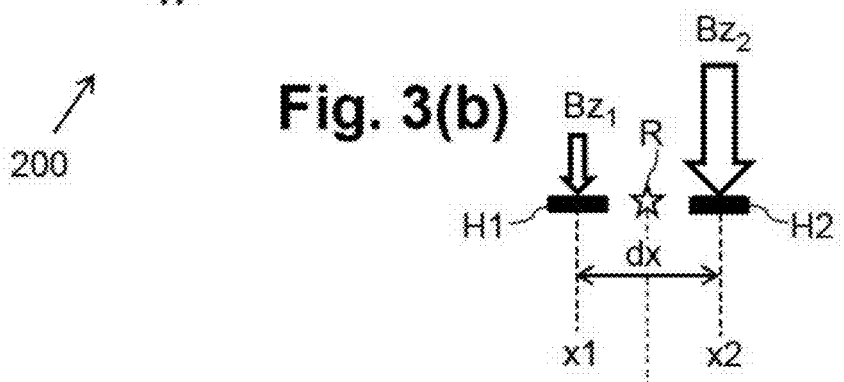
Fig. 3(b)
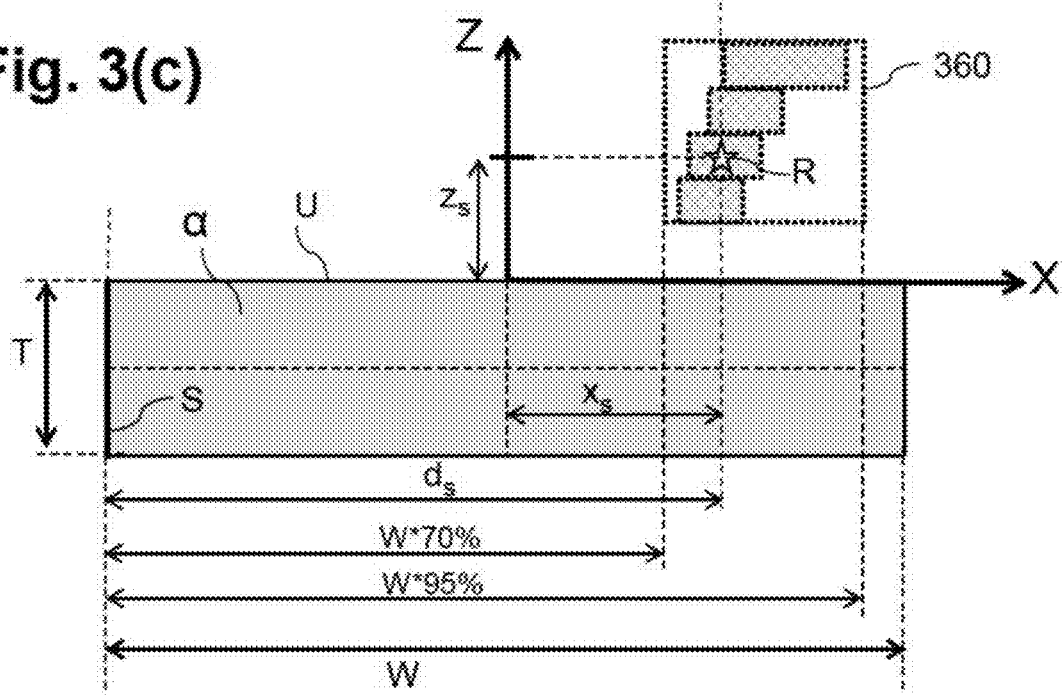
Fig. 3(c)
FIG 3

FIG 4
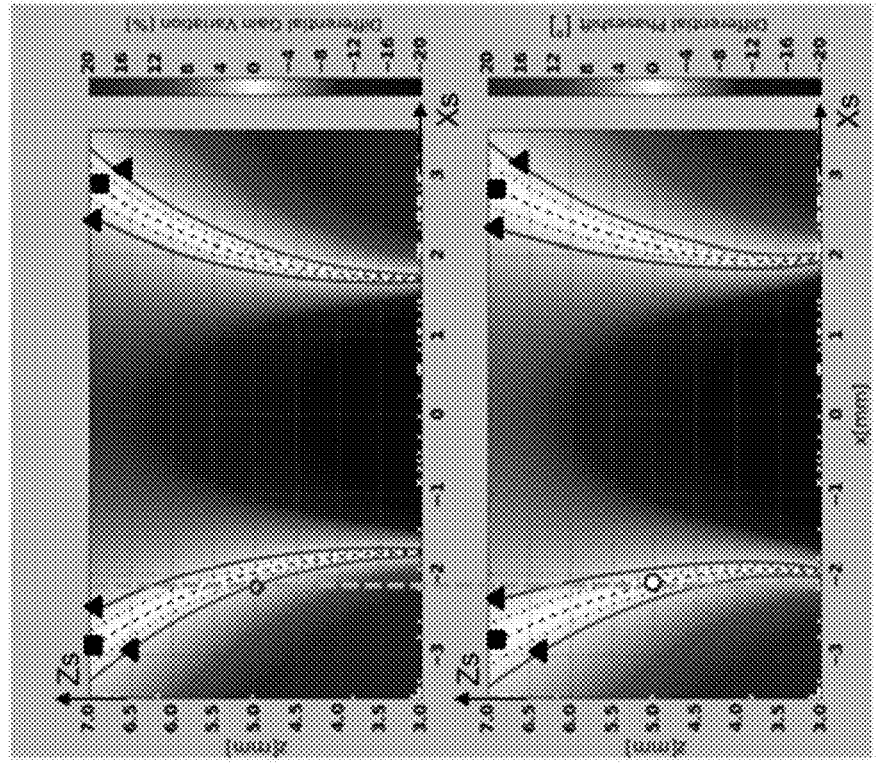
FIG 4(b)
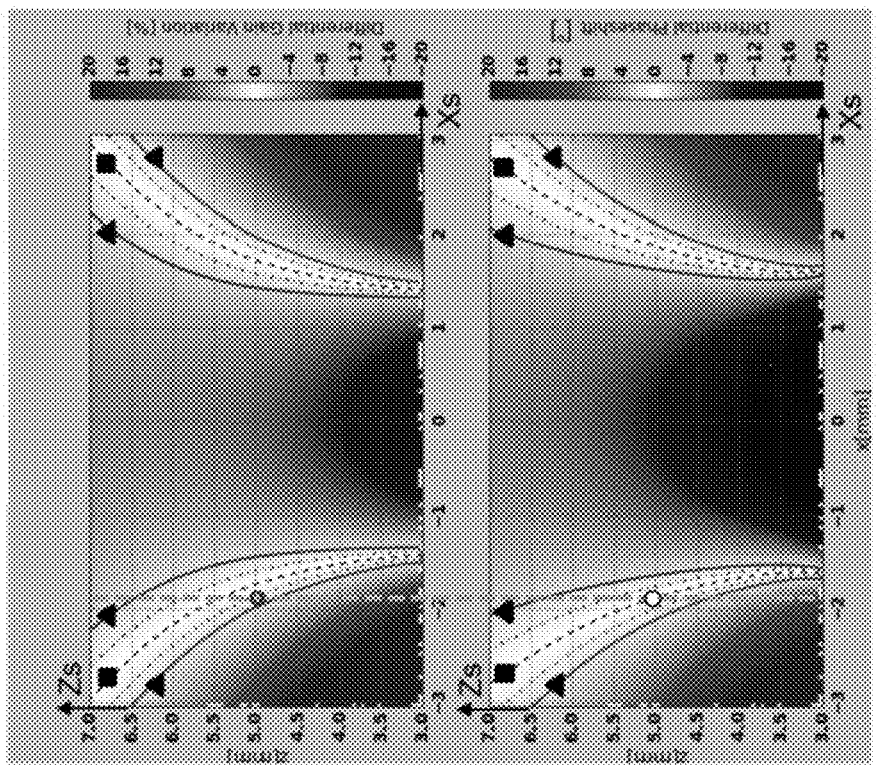
FIG 4(c)

dx=1.9mm; T=3mm; f=2kHz

| Width | 5 | 6 | 7 | 8 | 10 | (mm) |
|---|---|---|---|---|---|---|
| Aspect Ratio (W/T) | 1,67 | 2,00 | 2,33 | 2,67 | 3,33 | |

| Zs | 5 | 5 | 5 | 5 | 5 | (mm) |
|---|---|---|---|---|---|---|
| ds for 0% attenuation | 78 | 79 | 78 | 77 | 77 | % of W |
| ds for 0° phase shift | 81 | 81 | 80 | 79 | 79 | % of W |

| Zs | 4 | 4 | 4 | 4 | 4 | (mm) |
|---|---|---|---|---|---|---|
| ds for 0% attenuation | 75 | 75 | 75 | 75 | 75 | % of W |
| ds for 0° phase shift | 78 | 77 | 78 | 78 | 80 | % of W |

| Zs | 3 | 3 | 3 | 3 | 3 | (mm) |
|---|---|---|---|---|---|---|
| ds for 0% attenuation | 72 | 74 | 74 | 74 | 75 | % of W |
| ds for 0° phase shift | 75 | 76 | 78 | 79 | 82 | % of W |

FIG 5

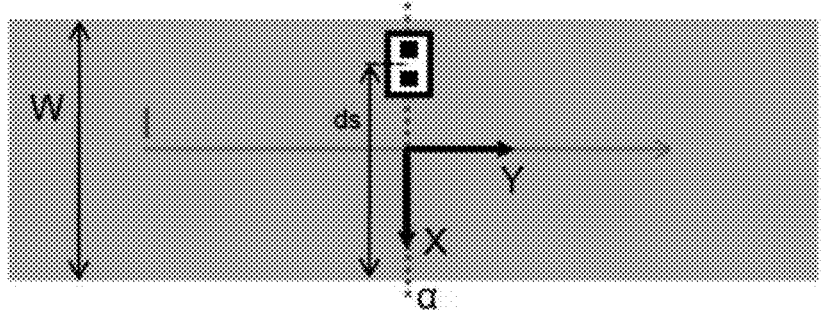
Fig. 10(a)
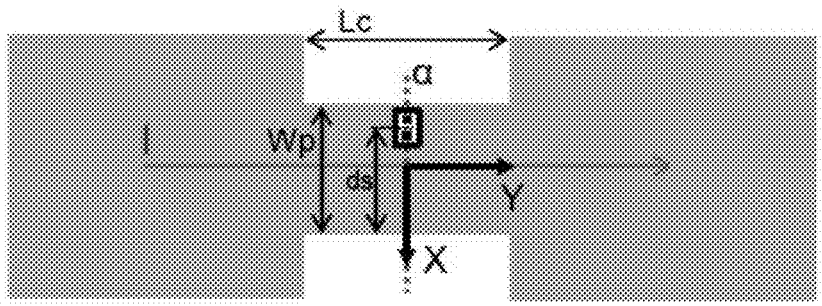
Fig. 10(b)
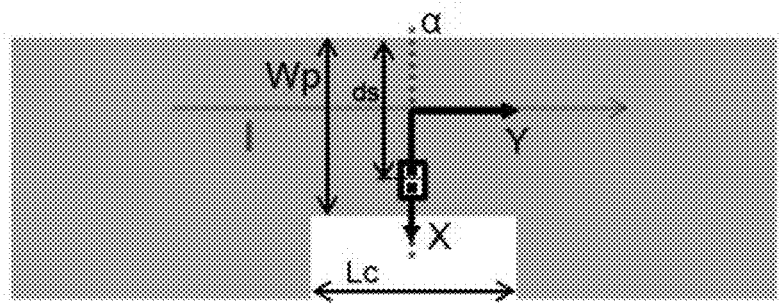
Fig. 10(c)
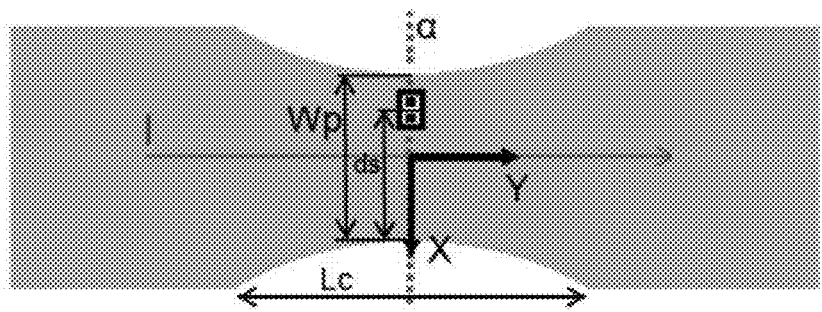
Fig. 10(d)
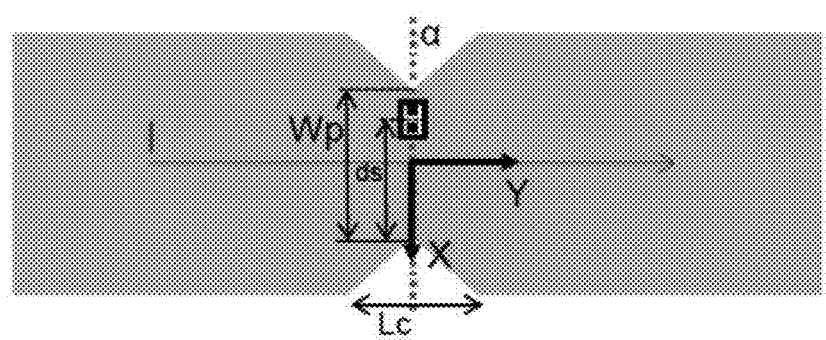
Fig. 10(e)
FIG 10

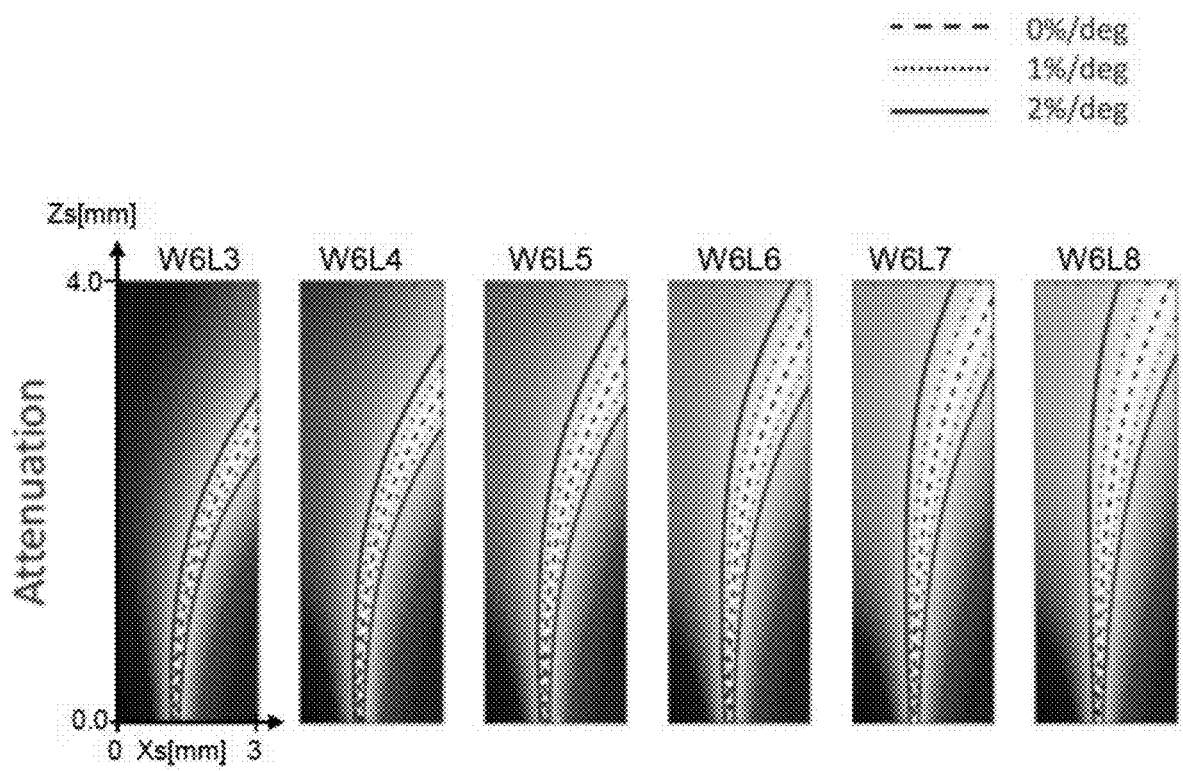
FIG 10(f)
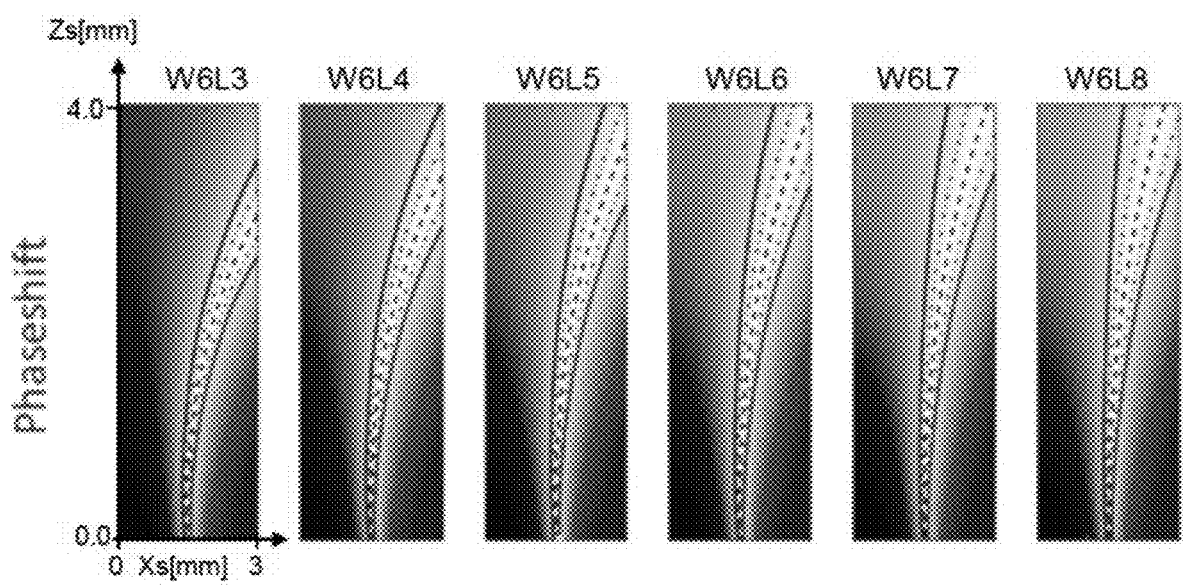
FIG 10(g)
FIG 10

Fig. 12(a)
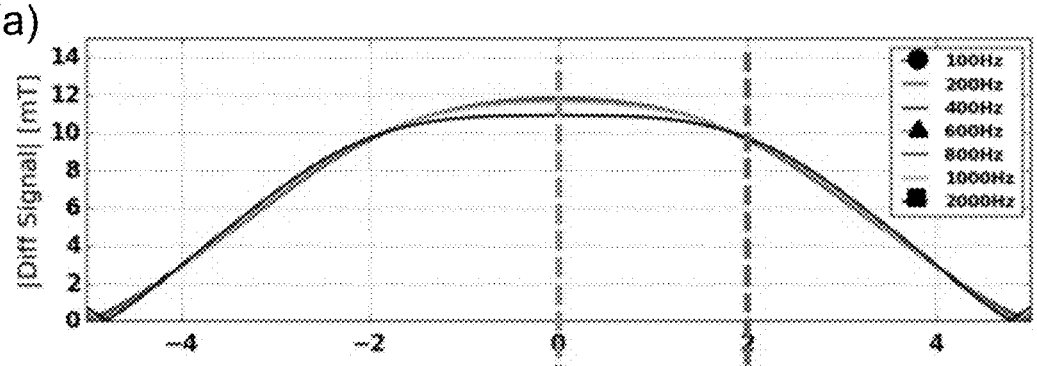
Fig. 12(b)
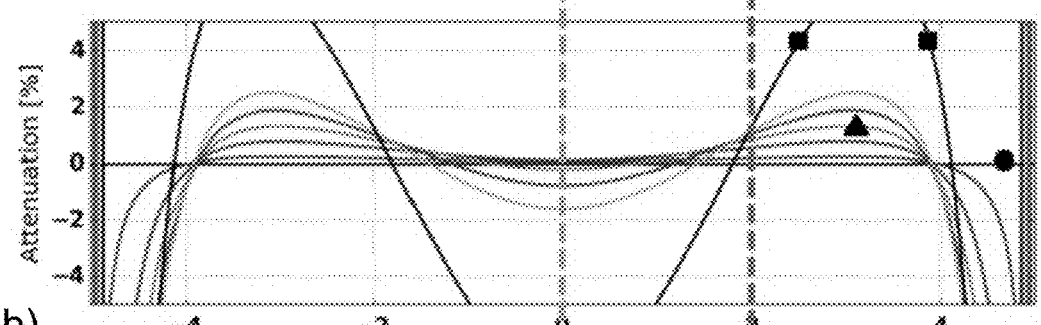
Fig. 12(c)
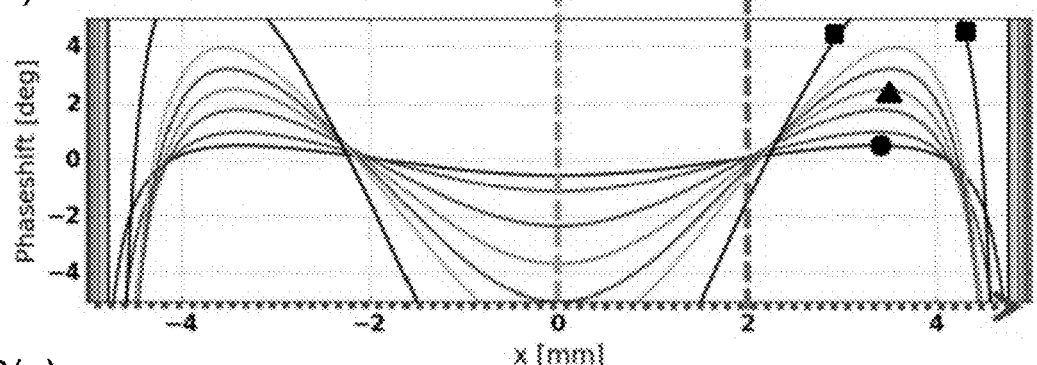
FIG 12

CURRENT SENSOR SYSTEM

FIELD OF THE INVENTION

The present invention relates in general to the field of current sensors, and more in particular to magnetic current sensors.

BACKGROUND OF THE INVENTION

Different kinds of current sensors are known in the art, for example (1) current sensors using a shunt resistor, (2) using a current transformer, (3) or using a magnetic sensor.

In current sensors using a shunt resistor, a voltage is measured over the shunt resistor, and the current value can be determined by dividing the measured voltage value and the resistor value. A disadvantage of this type is that the measurement circuit is not electrically isolated from the load. A current transformer includes primary and secondary coils. While this type of current sensor provides galvanic separation, it is usually very bulky. Current sensors based on magnetic sensors provide both galvanic separation and can be very compact.

Known current sensors are typically designed to measure DC currents or low frequency currents, for example currents having a frequency of about 50 Hz or about 60 Hz.

Various electrical motor types exist, for example: so called DC brushed motors, DC brushless motors, AC brushless motors, linear motors, stepper motors, etc. In electrical vehicles, the following motor types are typically used: DC Series Motor, Brushless DC Motor, Permanent Magnet Synchronous Motor (PMSM), Three Phase AC Induction Motors, Switched Reluctance Motors (SRM).

Various electrical circuits for driving and/or controlling and/or monitoring electrical motors exist. In some of these circuits the actual currents provided to the motor need to be measured. These currents may have a magnitude of several tens or even hundreds of Amperes, and may have a frequency or frequency components up to several kHz. These currents are typically provided to the motor via so called "busbars". Busbars often come in the form of a metallic strip or bar, for example a copper bar.

It is known that, when AC currents flow through an electrical conductor, a phenomenon known as "skin effect" will occur. This causes the effective electrical resistance of the electrical conductor to increase. The higher the frequency of the electrical current, the higher the effective resistance of the electrical conductor.

It is a challenge to measure an AC current with high accuracy.

SUMMARY OF THE INVENTION

It is an object of embodiments of the present invention to provide a current sensor system and a method for measuring an AC current, in particular an AC current flowing through a busbar.

It is an object of embodiments of the present invention to provide a current sensor system and a method for measuring an AC current with improved accuracy.

It is an object of embodiments of the present invention to provide a current sensor system and a method for measuring an AC current with improved accuracy, in a simple manner.

It is an object of embodiments of the present invention to provide a current sensor system and a method for measuring an AC current having a frequency or having frequencies in the range from about 100 Hz to about 2000 Hz.

It is an object of embodiments of the present invention to provide a current sensor system and a method for measuring an AC current having a frequency or having frequencies in the range from about 100 Hz to about 2000 Hz with an absolute accuracy within ±5%, or an absolute accuracy within ±4%, or an absolute accuracy within ±3%, or an absolute accuracy within ±2%, or an absolute accuracy within ±1%.

These and other objects are accomplished by a current sensor according to embodiments of the present invention.

According to a first aspect, the present invention provides a current sensor system for measuring an AC electrical current, comprising: a busbar having a predefined thickness and a predefined width, and having a substantially rectangular cross section; a sensor device comprising two sensor elements spaced apart by a predefined distance along a first direction (e.g. in a width direction of the busbar), each configured for measuring a magnetic field component oriented in a second direction (e.g. perpendicular to the first direction, e.g. in the thickness direction of the busbar); the sensor device being configured for determining a magnetic field difference or a magnetic field gradient along the first direction based on these magnetic field components, and for determining said AC current based on the magnetic field gradient or magnetic field difference; wherein the sensor device is positioned relative to the busbar such that a reference point of the sensor device situated in the middle between the two sensor elements is located at a first distance from a side of the busbar measured in the first direction, and is located at a second distance from the busbar measured in the second direction; wherein the first distance is a value in the range from 70% to 110% of the width of the busbar; and the second predefined distance is a value in the range from 0.5 mm to 4.0 mm.

An example of such a current sensor system is depicted in FIG. 3. According to the present invention, a reference point of the sensor device has to be positioned in a particular zone relative to the busbar. This allows to measure the AC current in a simple manner, yet with improved accuracy, despite the skin effect.

The inventors surprisingly found that a magnetic field gradient (dBz/dx) measured by this sensor device is substantially proportional to the AC current, not only for low frequency currents (e.g. smaller than 100 Hz), but also for AC currents having frequencies in a predefined frequency range including the range from 100 Hz to 2000 Hz, despite the skin effect.

It is pointed out that this location of the sensor device, or more in particular, of the reference point of the sensor device, is quite different from a location "above the center of the busbar".

It was surprisingly found that the gradient signal measured at this location, is substantially independent of AC frequency. Or stated in other words, it was surprisingly found that the gradient signal measured at this location is proportional to the amplitude of the AC current, with a predefined constant which is independent of the frequency in a predefined frequency range, for example for frequencies up to about 2 kHz, despite the skin effect.

In contrast, a gradient signal measured above the center of the busbar (as depicted in FIG. 1), is attenuated by approximately 12% for an AC current having a frequency of 2 kHz with respect to an AC current having a frequency of about 100 Hz with the same amplitude.

The inventors were very surprised that a location where the gradient is highly independent of the frequency even exists. Not only its existence, but also its location could not have been predicted based on prior art knowledge.

An important insight of the present invention is that an AC current can be measured with improved accuracy, by deliberately mounting the gradiometric sensor device at a predefined location, or rather within a predefined zone, also referred to herein as "sweet zone" relative to the busbar, and by measuring a gradient dBz/dx of the magnetic field at said location. It is an advantage that this current sensor has an excellent AC-response (=technical effect).

Preferably, the sensor device does not contain a flux concentrator (also known as integrated magnetic concentrator). Preferably, the busbar is not integrated inside the sensor device.

In an embodiment, the first distance (ds) is a value in the range from 70% to 95% of the width (W) of the busbar. Such a position is also substantially different from a location "above the edge" of the busbar.

In an embodiment, the frequency range is the range from 100 Hz to 2000 Hz.

In an embodiment, the frequency range is the range from 1 Hz to 2000 Hz.

In an embodiment, the frequency range is the range from 100 Hz to 2500 Hz.

In an embodiment, the frequency range is the range from 1 Hz to 2500 Hz.

In an embodiment, the sensor device is positioned relative to the busbar such that a ratio of the magnitude of the AC current and the magnitude of the magnetic field gradient is substantially constant within a predefined tolerance margin of ±3.0%, for AC currents having a frequency in a predefined frequency range comprising at least the range from 100 Hz to 2000 Hz.

In other words, the amplitude (or magnitude) of the magnetic field gradient (dBz/dx) is substantially proportional to the amplitude (or magnitude) of the AC current, using a constant factor, for an AC current having any frequency in the predefined frequency range.

With "the ratio being substantially constant" is meant that the amplitude (or magnitude) of the gradient is substantially equal to the amplitude (or magnitude) of the AC current (to be measured) multiplied by a predefined constant value, within a predefined tolerance margin, for any frequency in said frequency range.

In an embodiment, the predefined tolerance margin is ±2.5%.

In an embodiment, the predefined tolerance margin is ±2.0%.

In an embodiment, the predefined tolerance margin is ±1.5%.

In an embodiment, the predefined tolerance margin is ±1.0%.

In an embodiment, the sensor device is positioned relative to the busbar such that a phase shift of the magnetic field gradient or of the magnetic field gradient with respect to a phase of the AC current is substantially constant within a predefined tolerance margin of ±3.0°, for AC currents having a frequency in a predefined frequency range comprising at least the range from 100 Hz to 2000 Hz.

The predefined tolerance margin may be ±2.5°, or ±2.0°, or ±1.5°, or ±1.0°.

In an embodiment, the sensor device is positioned relative to the busbar such that a ratio of a complex representation of the magnetic field gradient and a complex representation of the AC current is a complex value having a substantially constant amplitude within a first predefined tolerance margin of ±3.0%, and having a substantially constant phase within a second predefined tolerance margin of ±3.0°, for AC currents having a frequency in a predefined frequency range comprising at least the range from 100 Hz to 2000 Hz.

The amplitude of the complex ratio is also referred to as the "attenuation", and the phase of the complex ratio is also referred to as the "phase shift". The first predefined tolerance margin may be ±3.0%, or ±2.5%, or ±2.0%, or ±1.5%, or ±1.0%. The second predefined tolerance margin may be ±3.0°, or ±2.5°, or ±2.0° or ±1.5°, or ±1.0°. All combinations of these first and second tolerance margins are envisioned.

In other words, in this embodiment, both the attenuation (A) and the phase shift (φ) of said magnetic field gradient (dBz/dx) relative to the sinusoidal AC current that generated it, are substantially independent of a frequency of the AC current.

In an embodiment, the first predefined tolerance margin is ±2.5% and the second predefined tolerance margin is ±2.5°.

In an embodiment, the first predefined tolerance margin is ±2.0% and the second predefined tolerance margin is ±2.0°.

In an embodiment, the first predefined tolerance margin is ±1.5% and the second predefined tolerance margin is ±1.5°.

In an embodiment, the first predefined tolerance margin is ±1.0% and the second predefined tolerance margin is ±1.0°.

In these examples, the numerical value of the first and second tolerance margin is the same, but that is not required for the invention to work.

In an embodiment, the first predefined tolerance margin is ±4.0% and the second predefined tolerance margin is ±1.0°.

In an embodiment, the first predefined tolerance margin is ±3.0% and the second predefined tolerance margin is ±1.0°.

In an embodiment, the sensor device is positioned relative to the busbar such that a real part of the first magnetic field component (Bz1) is substantially equal to a real part of the second magnetic field component (Bz2) within a (third) predefined tolerance margin of ±3.0%, and such that an imaginary part of the first magnetic field component (Bz1) is substantially equal to an imaginary part of the second magnetic field component (Bz2) within said predefined (third) tolerance margin, for AC currents having a frequency in a predefined frequency range comprising at least the range from 100 Hz to 2000 Hz.

In an embodiment, the (third) predefined tolerance margin is ±2.5%, or ±2.0%, or ±1.5%, or ±1.0%.

In an embodiment, the rectangular cross section of the busbar has a thickness in the range from 2.0 to 5.0 mm, or in the range from 3.0 to 5.0 mm.

In an embodiment, the rectangular cross section of the busbar has a width or an effective width in the range from 3.0 to 10.0 mm, or in the range from 4.0 to 10.0 mm, or in the range from 5.0 to 10.0 mm, or in the range from 3.0 mm to 8.0 mm, or in the range from 4.0 mm to 8.0 mm, or in the range from 5.0 to 8.0 mm.

In an embodiment, this width is constant over a length of at least 10 mm or at least 15 mm, or at least 20 mm, in the vicinity of the sensor elements, e.g. as illustrated in FIG. 1(a), at least 5 mm on either side of the virtual plane α in which the sensor elements are located, along the longitudinal direction of the busbar.

In an embodiment, the two sensor elements are two horizontal Hall elements. These sensor elements are preferably integrated in a semiconductor substrate. The semiconductor substrate is preferably oriented parallel to a surface of the busbar, perpendicular to the rectangular cross-section of the busbar. The two sensor elements are preferably spaced apart in the width direction of the busbar.

In an embodiment, the two horizontal Hall elements are spaced apart by a distance in the range from 0.5 mm to 4.0 mm, or in the range from 0.5 mm to 3.0 mm, or in the range from 1.0 mm to 4.0 mm, or in the range from 1.0 mm to 3.0 mm, or in the range from 1.5 to 2.5 mm, for example equal to about 500 µm, or equal to about 600 µm, or about 700 µm, or about 800 µm, or about 900 µm, or about 1000 µm, or about 1100 µm, or about 1200 µm, or about 1300 µm, or about 1400 µm, or about 1500 µm, or about 1600 µm, or about 1700 µm, or about 1800 µm, or about 1900 µm, or about 2000 µm, or about 2100 µm, or about 2200 µm, or about 2300 µm, or about 2400 µm, or about 2500 µm, or about 2600 µm, or about 2700 µm, or about 2800 µm, or about 2900 µm, or about 3000 µm.

Simulations have shown that the location of the "sweet spot" (where attenuation deviation=0% and the phase shift=0°) may slightly change if the distance dx between the Hall elements is slightly changed.

In an embodiment, the second predefined distance is a value in the range from 0.5 mm to 4.0 mm, or in the range from 1.0 mm to 4.0 mm, or in the range from 1.5 mm to 4.0 mm, or in the range from 1.5 mm to 3.0 mm, or in the range from 0.5 mm to 3.5 mm, or in the range from 1.0 mm to 3.0 mm, for example equal to about 0.5 mm, or equal to about 1.0 mm, or equal to about 1.5 mm, or equal to about 2.0 mm, or equal to about 2.2 mm.

In an embodiment, the two horizontal Hall elements are spaced apart by a distance in the range from 0.5 mm to 4.0 mm, or in the range from 1.0 mm to 3.0 mm, or in the range from 1.5 mm to 2.5 mm; and the rectangular cross section of the busbar has a thickness in the range from 2.0 mm to 5.0 mm and a width in the range from 3.0 mm to 10 mm (or in the range from 5 mm to 10 mm); and the reference point is located in one or more of the following zones: i) in a predefined zone where first predefined distance (ds) is a value in the range from 70% to 95% of the width of the busbar, and the second predefined distance (Zs) is a value from 0.5 to 4.0 mm; ii) in a predefined zone where the first predefined distance (ds) is a value in the range from 70% to 82% of the width, and the second predefined distance (Zs) is a value from 0.5 to 1.5 mm; iii) in a predefined zone where the first predefined distance (ds) is a value in the range from 72% to 87% of the width and the second predefined distance (Zs) is a value from 1.5 to 2.5 mm; iv) in a predefined zone where the first predefined distance (ds) is a value in the range from 77% to 95% of the width, and the second predefined distance (Zs) is a value from 2.5 to 4.0 mm.

In an embodiment, the two horizontal Hall elements are spaced apart by a distance in the range from 0.5 mm to 4.0 mm, or in the range from 1.0 mm to 3.0 mm, or in the range from 1.5 mm to 2.5 mm; and the rectangular cross section of the busbar has a thickness in the range from 2.0 mm to 5.0 mm and a width in the range from 3.0 mm to 10 mm (or in the range from 5 mm to 10 mm); and the reference point is located in one or more of the following zones: i) in a predefined zone where the first predefined distance (ds) is a value in the range from 70% to 95% of the width (W) of the busbar, and the second predefined distance (Zs) is a value from 1.0 to 3.5 mm; ii) in a predefined zone where the first predefined distance (ds) is a value in the range from 70% to 82% of the width, and the second predefined distance (Zs) is a value from 1.0 to 1.5 mm; iii) in a predefined zone where the first predefined distance (ds) is a value in the range from 72% to 87% of the width, and the second predefined distance (Zs) is a value from 1.5 to 2.5 mm; iv) in a predefined zone where the first predefined distance (ds) is a value in the range from 77% to 95% of the width, and the second predefined distance (Zs) is a value from 2.5 to 3.5 mm.

In a variant, the rectangular cross section of the busbar has a thickness in the range from 3.0 mm to 5.0 mm and a width in the range from 5.0 mm to 10.0 mm, and the reference point is located in any of the zones described above.

In an embodiment, the two horizontal Hall elements are spaced apart by a distance in the range from 0.5 mm to 4.0 mm, or in the range from 1.0 to 3.0 mm, or in the range from 1.5 mm to 2.5 mm; and the rectangular cross section of the busbar has a thickness in the range from 2.0 mm to 5.0 mm and a width in the range from 3.0 mm to 10 mm; and the reference point is located in one or more of the following zones: i) in a predefined zone where the first predefined distance (ds) is a value in the range from 74% to 88% of the width of the busbar, and the second predefined distance (Zs) is a value from 1.0 to 3.3 mm; ii) in a predefined zone where the first predefined distance (ds) is a value in the range from 74% to 81% of the width, and the second predefined distance (Zs) is a value from 1.0 to 2.0 mm; iii) in a predefined zone where the first predefined distance (ds) is a value in the range from 75% to 86% of the width, and the second predefined distance (Zs) is a value from 2.0 to 2.5 mm; iv) in a predefined zone where the first predefined distance (ds) is a value in the range from 77% to 88% of the width, and the second predefined distance (Zs) is a value from 2.5 to 3.3 mm.

In a variant, the rectangular cross section of the busbar has a thickness in the range from 3.0 mm to 5.0 mm and a width in the range from 6.0 mm to 10.0 mm, and the reference point is located in any of the zones described above.

In an embodiment, the two horizontal Hall elements are spaced apart by a distance in the range from 0.5 mm to 4.0 mm, or in the range from 1.0 mm to 3.0 mm, or in the range from 1.5 mm to 2.5 mm; and the rectangular cross section of the busbar has a thickness in the range from 2.0 mm to 5.0 mm and a width in the range from 3.0 mm to 10 mm; and the reference point is located in one or more of the following zones: i) in a predefined zone having a trapezoidal shape in the cross-sectional plane, the trapezoidal shape defined by interconnecting the following four points by straight lines: (ds=80%, Zs=4.0 mm), (ds=110%, Zs=4.0 mm), (ds=85%, Zs=2.0); ii) in a predefined zone having an irregular pentagonal shape in the cross-sectional plane, defined by interconnecting the following five points by straight lines: (ds=80%, Zs=4.0 mm), (ds=98%, Zs=4.0 mm), (ds=98%, Zs=3.0 mm), (ds=85%, Zs=2.0 mm), (ds=75%, Zs=2.0 mm); iii) in a predefined zone having a trapezoidal shape in the cross-sectional plane defined by interconnecting the following four points by straight lines: (ds=70%, Zs=0.0 mm), (ds=75%, Zs=2.0 mm), (ds=85%, Zs=2.0 mm), (ds=85%, Zs=0.0 mm); where ds is the first distance, and Zs is the second distance.

In a variant of this embodiment, the irregular pentagonal zone is truncated to a maximum ds-value of 96% (instead of 98%), or 94%, or 92% or 90% or 88%.

In a variant of this embodiment, the width of the busbar is a value in the range from 4.0 mm to 10.0 mm, or in the range from 5.0 mm to 10.0 mm.

In an embodiment, the busbar has a substantially beam shaped portion over a length of at least 5.0 mm with a constant rectangular cross section near the location where the sensor device is located.

In an embodiment, the two horizontal Hall elements are both located "above the busbar". Or stated in other words, in these embodiments, a projection of the two Hall elements (in the thickness direction) results in two intersections with the busbar.

In an embodiment, one of the two horizontal Hall elements is located "above the busbar", and the other of the two horizontal Hall elements is located "next to" of the busbar. Or stated in other words, in these embodiments, a projection of the two Hall elements (in the thickness direction) results in only one intersection with the busbar.

In an embodiment the sensor device further comprises at least one temperature sensor and at least one mechanical stress sensor; and the sensor device is further configured for determining said AC current based on the magnetic field gradient and based on one or both of said temperature and said mechanical stress.

In an embodiment, the sensor device comprises a first and a second temperature sensor for measuring a temperature of the first and second magnetic sensor element, and comprises a first and a second mechanical stress sensor for measuring a mechanical stress exerted upon the first and second magnetic sensor element, and the sensor device is further configured for determining said AC current based on the magnetic field gradient, and based on said first and second temperature, and said first and second mechanical stress, for example in a manner as described in EP3109658(A1).

In another embodiment, the sensor device comprises a semiconductor substrate comprising the first and second magnetic sensor element, a first and second biasing means for biasing the first and second magnetic sensor element, a first and a second amplifier for amplifying the first and second sensor signal provided by the first and second magnetic sensor element, and an analog-to-digital convertor (ADC) for digitizing the first and second sensor signal, or a signal derived therefrom; and wherein the sensor device further comprises at least one of: (i) a temperature sensor, and (ii) a differential stress sensor for measuring a differential stress exerted upon the first and second magnetic sensor; and wherein the sensor device is further configured for adjusting at least one of a biasing signal, the second amplifier gain, and a digital value of the amplified second sensor signal, based on a predefined function of the temperature value (T) and/or the differential stress value ($\Delta\Sigma$), before determining a difference between: a first signal or a first value derived from the first sensor signal, and a second signal or a second value derived from the second sensor signal; for example in a manner as described in co-pending patent application number EP20165059.5 filed on 23 Mar. 2020 by the same applicant, and/or in co-pending patent application EP21161150.4 filed on 7 Mar. 2021 by the same applicant, both of which are incorporated herein by reference in their entirety.

According to a second aspect, the present invention also provides a method of measuring an AC electrical current having a frequency in a predefined frequency range, using a current sensor system according to the first aspect, the method comprising the steps of: a) measuring, by the sensor device, a first and a second magnetic field component (e.g. Bz1, Bz2) oriented in the second direction (e.g. in the thickness direction of the busbar) at two different locations spaced apart along the first direction (e.g. in the width direction of the busbar); b) determining a difference of these magnetic field components; c) determining said AC current based on said difference.

In an embodiment, the sensor device comprises a digital processing circuit, and step b) and c) are performed by said digital processing circuit comprised in the sensor device.

In an embodiment, step c) comprises: determining the AC current by multiplying an amplitude of the difference $\Delta Bz$ or magnetic field gradient $dBz/dx$ by a predefined factor.

This factor may be a predefined constant value. This value can be determined by calibration, or by simulation, or in any other suitable way. This constant may be hardcoded or may be stored in a non-volatile memory of the sensor device.

In an embodiment, the method further comprises step d) of measuring a temperature of one or both sensor elements and/or measuring a mechanical stress exerted upon one or both sensor elements; and step c) comprises: determining said AC current based on the magnetic field gradient and based on one or both of said temperature and said mechanical stress.

Correction for temperature and/or mechanical stress can for example be performed in the same way as described in EP3109658(A1), incorporated herein by reference in its entirety.

In an embodiment, the sensor device further comprises a semiconductor substrate comprising the first and second magnetic sensor element, a first and second biasing means for biasing the first and second magnetic sensor element, a first and a second amplifier for amplifying the first and second sensor signal provided by the first and second magnetic sensor element, an analog-to-digital convertor for digitizing the first and second sensor signal or a signal derived therefrom; and at least one of: i) a temperature sensor for measuring a temperature of the semiconductor substrate, and ii) a differential stress sensor for measuring a differential stress exerted upon the first and second magnetic sensor; and a processing means having an input port connected to an output of the ADC; and wherein the method further comprises step d) of measuring a temperature and/or measuring a mechanical differential stress; and wherein the method further comprises the step of: adjusting a biasing signal and/or adjusting an amplifier gain and/or adjusting a digital value of the amplified second sensor signal, based on a predefined function of the measured temperature and/or the measured differential stress, before determining a difference between: a first signal or a first value derived from the first sensor signal, and a second signal or a second value derived from the second sensor signal.

These method steps are described in more detail in co-pending patent application number EP20165059.5 filed on 23 Mar. 2020 by the same applicant, and in co-pending patent application EP21161150.4 filed on 7 Mar. 2021 by the same applicant, both of which are incorporated herein by reference in their entirety.

It is a major advantage of this method that it can further improve the accuracy of the AC current measurement, in particular by substantially reducing or even completely eliminating an external disturbance field.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1 including FIGS. 1(a) to 1(c), 1(a) shows a perspective view, and FIG. 1(b) shows a cross sectional view of a current sensor arrangement, where a current sensor device is mounted above, substantially in the middle of a busbar.

FIG. 1(c) shows the magnitude of a magnetic field gradient $dBz/dx$ measured by the sensor device of FIG. 1(a) for various locations of the sensor device along the X-axis, and for various frequencies. As can be seen, the center position provides the largest signal.

FIG. 2 including FIGS. 2(a) to 2(c), 2(a) shows a plot of the amplitude of a magnetic field gradient dBz/dx measured at various locations in a transverse direction of a busbar and for various frequencies.

FIG. 2(b) shows a plot of the attenuation of the magnetic field gradient dBz/dx for a sinusoidal current signal of frequency f, relative to the magnetic field gradient dBz/dx for a DC-signal measured at the same location, for various locations in a transverse direction of the busbar, and for various frequencies.

FIG. 2(c) shows a plot of the phase shift of the magnetic field gradient dBz/dx for a sinusoidal current signal of frequency f, relative to the magnetic field gradient dBz/dx for a DC-signal measured at the same location, for various locations in a transverse direction of the busbar, and for various frequencies.

FIG. 3 including FIGS. 3(a) to 3(c), 3(a) shows a current sensor system proposed by the present invention.

FIG. 3(b) is a schematic representation of two sensor elements spaced apart from each other, defining an (imaginary) reference point in the middle between them.

FIG. 3(c) is a schematic representation showing preferred positions of the sensor device relative to the busbar, as proposed by the present invention.

FIG. 4(b) to FIG. 4(e) show curves for a busbar having a width of 6, 7, 8 and 10 mm respectively.

FIG. 5 shows a table corresponding to the graphs of FIG. 4(a) to FIG. 4(e), showing the ideal lateral position of the sensor device for achieving 0% attenuation, and the ideal lateral position for achieving 0° phase shift, of the magnetic field gradient dBz/dx, for a distance of 3, 4 or 5 mm from the busbar. As can be seen, these ideal positions are not identical, but surprisingly very close to each other.

FIG. 6(b) shows "0% attenuation curves" for busbars having a thickness T from 2 mm to 5 mm, and having a width W from 5 mm to 10 mm, for various positions of the sensor device relative to the busbar. Also indicated are "preferred regions" where a reference point of the sensor device is to be located according to embodiments of the present invention.

FIG. 10, including FIGS. 10(a) to 10(g), 10(a) to FIG. 10(e) show various busbars in top view. The busbar of FIG. 10(a) is a straight busbar. The busbar of FIG. 10(c) has a single cutout (or notch). The busbars of FIG. 10(b),(d),(e) have two cut-outs on opposite sides of the busbar. These busbars can also be used in embodiments of the present invention. The effective width Wp to be taken into account is indicated in each of these drawings.

FIG. 10(f) and FIG. 10(g) show simulation results for the busbar of FIG. 10(b) having an effective width of 6 mm, and for a length of the cutout ranging from 3 mm to 8 mm.

FIGS. 11(a) and 11(b), 11(a) shows a top view, and FIG. 11(b) shows a cross-sectional view of a portion of a busbar having two slits on opposite sides of the busbar, forming a zigzag passage of the current. This busbar can also be used in embodiments of the present invention, provided that the slits are sufficiently wide (in the Y direction), and sufficiently far apart from each other, and sufficiently deep (in the X direction). The effective width Wp to be taken into account is indicated in these drawings.

FIG. 12, including FIG. 12(a) to FIG. 12(c), show plots similar to those of FIG. 2(a) to FIG. 2(c), but for the busbar of FIG. 11, having two slits forming a zigzag.

Figures 4, 4A:
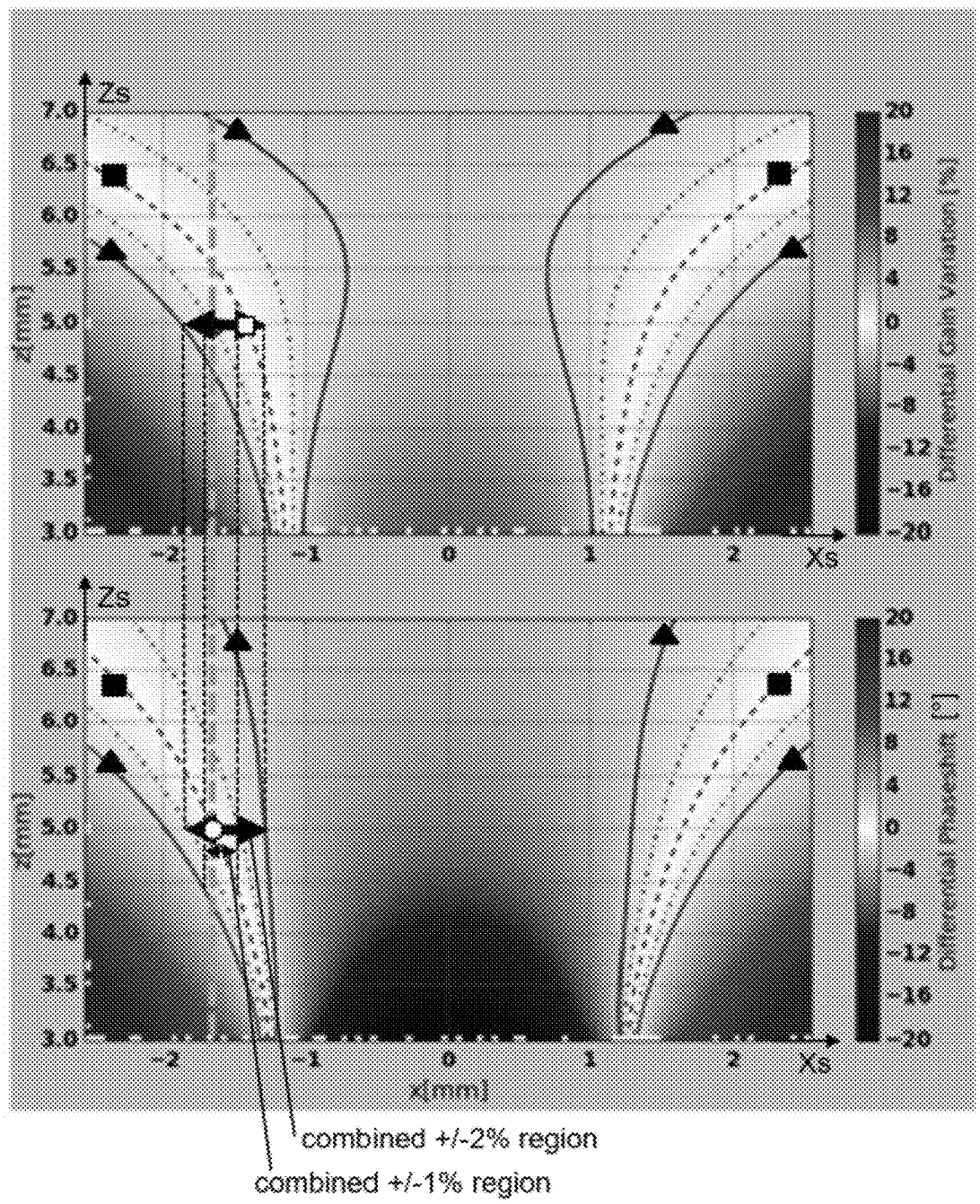
FIG. 4 including FIG. 4(a) to FIG. 4(e), each show an upper graph and a lower graph. The upper graph shows attenuation variations (in %), and the lower graph shows phase shift variations (in °) of the magnetic field gradient dBz/dx for various positions of the sensor device relative to the busbar.
FIG. 4(a) shows curves for a busbar having a width of 5 mm.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the expression "current sensor system" or "current sensor arrangement" mean the same. They refer to a system or arrangement comprising a busbar for conducting an electrical current and a current sensor device for measuring that current.

It is known that complex numbers can be represented by a magnitude (or amplitude) and a phase, or by a real part and an imaginary part. For example, the complex number "1+i" can also be represented by a vector having an amplitude (or magnitude) of $\sqrt{2}$ and a phase of 45°.

In this document, the term "magnetic field gradient" $dBz/dx$ refers to a spatial gradient of the magnetic field component Bz along the X-direction. In practice, the division by dx is often omitted.

In this document, the term "magnetic field difference" $\Delta Bz$ is used to indicate a difference between two magnetic field components.

In this document, the terms "magnetic field gradient" and "magnetic field difference" can be used interchangeable, unless explicitly mentioned otherwise or clear from the context otherwise.

The present invention relates to current sensors based on magnetic sensors, also referred to as "magnetic current sensors", as may be used in industrial or automotive applications, e.g. for measuring one or more currents provided to an electrical motor, e.g. in electrical or hybrid vehicles. Such electrical motors may be driven using relatively large AC currents, for example substantially sinusoidal currents having amplitudes of tens or even hundreds of amperes. The present invention is particularly concerned with accurately measuring such AC currents.

As already mentioned in the background section, it is known that, when AC currents flow through an electrical conductor, a phenomenon known as "skin effect" will occur. This causes the effective electrical resistance of the electrical conductor to increase. The higher the frequency of the electrical current, the higher the effective resistance of the electrical conductor.

The inventors of the present invention had the task of providing a sensor system capable of measuring an AC current flowing through a busbar such as the one shown in FIG. 1(a), with improved AC accuracy. The AC current may for example be a sinusoidal current having any frequency from e.g. 100 Hz to e.g. 2000 Hz.

The inventors decided to use a gradiometric sensor device, i.e. a sensor device capable of measuring a magnetic field gradient, because this offers the advantage that the sensor is highly insensitive to an external disturbance field, despite the disadvantage that a gradient signal is typically an order of magnitude weaker than the magnetic component signals from which the gradient is derived.

FIG. 1(a) shows a perspective view, and FIG. 1(b) shows a cross sectional view of a current sensor 100, comprising a busbar 101 extending in a longitudinal direction (the Y-direction). The busbar 101 has a thickness T in the Z-direction, and a width W in the X-direction. The busbar 101 has a rectangular cross section in a transversal plane α parallel to the X-Z plane. The current I to be measured flows in the Y-direction, substantially perpendicular to the transversal plane α.

FIG. 1(c) shows curves of the magnitude |ΔBz| of a difference between two magnetic field components Bz1, Bz2 oriented in the Z-direction, measured at two locations spaced apart in the X-direction, of a magnetic field created by a sinusoidal current, when the sensor device 102 is located at a certain distance "g" (also referred to as "airgap"), as a function of the transverse position x.

These curves can be obtained for example by performing simulations. Simulations were performed for a sinusoidal current having a frequency of 100 Hz, 200 Hz, 400 Hz, 600 Hz, 800 Hz, 1000 Hz and 2000 Hz, using a busbar having a width of 6 mm and a thickness of 3 mm, and assuming the sensor elements are spaced apart by 2.2 mm.

As can be seen, the largest amplitude of |ΔBz| is obtained when the sensor device 102 is positioned in the middle of the busbar 101. This is the position where the "largest signal" can be measured, thus providing the best signal-to-noise ratio (SNR), but in this position the measurement is very much dependent on the frequency of the AC current, which is undesirable.

The inventors went a step further and noticed that the curves for relatively low frequencies substantially coincide (this is the case for the curves of 100 Hz to 600 Hz), but as the frequency increases, the curves start to deviate, especially near the centre of the busbar. Indeed, the maximum of the 800 Hz, 1000 Hz and 2000 Hz curve is only about 97%, 95%, and 88% of the maximum of the 100 Hz curve, respectively. Or stated in other words, the gradient signal of 800 Hz, 1000 Hz and 2000 Hz is attenuated by 3%, 5% and 12% respectively, because of the skin effect.

This means that, if the current would be perfectly sinusoidal, and if the frequency of the current would be known, the sensor device could compensate for this attenuation and provide an accurate measurement, but the problem is that, in general, the AC currents provided to a motor have varying frequencies and/or are not perfectly sinusoidal, meaning that, in general, the current waveform has many frequencies. It therefore seemed impossible to accurately measure the current without determining the frequency content. In some applications, it is also desirable to be able to accurately detects system faults, such as current spikes or over-currents, which may occur at higher frequencies than the fundamental frequency provided to the load.

The inventors went another step further, and surprisingly noticed that the curves change position as the sensor device is mounted closer to the edge of the busbar. Indeed, as can be seen in FIG. 1(c), the 2000 Hz curve (indicated with a black square) provides a larger gradient signal than the 100 Hz curve (indicated by a black circle, which is located lower than the curve with the square), contrary to the position of the curves near the center. This position change seems to occur near the point indicated with letter "C". The inventors decided to investigate this in more detail in FIG. 2(a) to FIG. 2(c).

FIG. 2(a) is a replica of FIG. 1(c), showing a plot of the amplitude of the magnetic field gradient dBz/dx, or actually the amplitude of the signal ΔBz, or |Bz|=|Bz1−Bz2|, Bz1 being the value of a first magnetic field component Bz1 measured at a first sensor location x1, and Bz2 being the value of the second magnetic field component measured at the second sensor location x2, spaced apart from x1 by a distance dx along the X-direction (see FIG. 3(b)). Curves are shown for a number of frequencies.

Rather than staring at the amplitude signal of FIG. 2(a), and wondering how to cope with the different attenuations for different frequencies (the 97%, the 95% and the 88% mentioned above), the inventors took a radically different approach, and came to the idea of simulating and visualising the attenuation (or attenuation variations relative to the gradient of a 100 Hz signal) and phase shift of the signal ΔBz(f) as a function of the position of the sensor device along the X-axis, for various frequencies, resulting in FIG. 2(b) and FIG. 2(c) respectfully.

FIG. 2(b) shows a graph with attenuation curves, and FIG. 2(c) shows a graph with phase shift curves of the differential signal ΔBz(f) as a function of the position along the X-axis, for several frequencies ranging from 100 Hz to 2000 Hz.

Very surprisingly, and totally unexpectedly, they discovered that the relative attenuation curves of 100 Hz, 200 Hz, 400 Hz, 600 Hz, 800 Hz, 1000 Hz and 2000 Hz all seem to pass through a single (virtual) point "D", and they discovered that the phase shift curves of 100 Hz, 200 Hz, 400 Hz, 600 Hz, 800 Hz, 1000 Hz and 2000 Hz all seem to pass through a single (virtual) point "E", and they noticed that, even though the points "D" and "E" do not exactly coincide, they are located very close together.

The inventors wondered what would happen if the sensor device would be placed at a position along the X-axis, in close vicinity to the point "D" and "E", for example at point "D", or at point "E", or between point "D" or "E", e.g. in the middle between point "D" and "E". And they also wondered where the points "D" and "E" are located in practice, on which parameters they depend, and how they can be determined.

With this in mind, they performed another set of simulations, the results of which are depicted in FIG. 4 and FIG. 5, but before describing them, the parameters involved are explained in FIG. 3(a) to FIG. 3(c).

FIG. 3(a) shows a current sensor system 200 proposed by the present invention. The current sensor system 200 comprises a busbar 201 and a current sensor device 202 mounted relative to the busbar. The busbar 201 may for example be a metallic bar having an elongated shape extending in the Y-direction and having a rectangular cross section in a plane substantially perpendicular to the direction of the current when flowing through the busbar. This cross-section has a thickness T and a width W.

In all embodiments of the present invention, it is assumed that the width W is equal to or larger than the thickness T (W≥T). The busbar can for example be made of copper or aluminium, or a copper alloy or an aluminium alloy, but the present invention is not limited thereto, and other electrically conductive materials can also be used.

The current sensor device 202 is an integrated semiconductor device comprising a substrate (not explicitly shown), comprising at least two magnetic sensor elements H1, H2, for example two horizontal Hall elements, spaced apart over a distance dx. This distance is preferably a value in the range from about 1.0 mm to 2.5 mm, or from 1.5 mm to 2.5 mm, e.g. equal to about 1.8 mm, or equal to about 2.0 mm, or equal to about 2.2 mm, but the present invention is not limited thereto and other distances in the range from 0.5 mm to 4.0 mm are also contemplated.

FIG. 3(b) is a schematic representation of a current sensor as can be used in embodiments of the present invention, containing two horizontal Hall elements H1, H2. The sensor device 201 is preferably oriented such that the semiconductor substrate is substantially parallel to the upper surface of the busbar, i.e. parallel to the X-Y plane of FIG. 3(a), or stated in other words: parallel to the longitudinal direction Y, and parallel to the transverse direction X (also referred to as the "width direction"). The first horizontal Hall element H1 is located at a first sensor position x1. The second horizontal Hall element H2 is located at the second sensor position x2, at a distance dx from the first sensor location along the X-axis, i.e. in a transverse direction of the busbar. For the sake of the description, an (imaginary) reference point "R" is defined in the middle between the first and second sensor element, thus at position x=(x1+x2)/2 along the X-axis. This reference point "R" allows the position of the sensor device 202 to be defined by two parameters: a first distance "Zs" (measured in the Z-direction) between the reference point "R" and the busbar 201, and a second distance "ds" (measured in the X-direction), between the reference point "R" and a side "S" of the busbar 201, as illustrated in FIG. 3(c).

FIG. 3(c) is a schematic representation showing preferred positions of the reference point "R", and thus of the sensor device 202 relative to the busbar 201, as proposed by the present invention.

As proposed herein, the sensor device 202 is to be positioned relative to the busbar 201 such that the reference point R is to be located in the rectangular area 360, referred to herein as the "sweet zone". In its broadest form, this zone can be specified as the zone where the first distance "Zs" between the reference point R of the sensor device and the busbar, measured in the Z-direction, is a value in the range from 0.5 mm to 4.0 mm; and where the second distance "ds" between the reference point R and the side "S" of the busbar, measured in the X-direction, is a value in the range from 70% to 110% of the width "W", or in the range from 70% to 95% of the width "W" of the busbar. Of course, other parameters can be used to define the same location. For example, instead of specifying the distance "ds" between the reference point R and the side surface S of the busbar (measured in the X-direction), one could also specify the parameter "Xs" being the distance between the reference point R and the middle of the busbar, measured in the X-direction. The parameter Xs can be converted into the parameter ds, using the formula: ds=(W/2)+Xs. As an example, the location Xs=20% of the half width (W/2) corresponds to ds=50%+10%=60% from the side of the busbar. Other examples will be given further.

It was surprisingly found that, if the sensor device 201 is positioned with its reference point R inside this "sweet zone", the sensor system has a better AC response as compared to that of the system of FIG. 1 where the sensor device is located in the middle of the busbar, despite the amplitude of the signal ΔBz(at 100 Hz) of point C of FIG. 2(*a*) being only about 76% of the amplitude of the signal ΔBz(at 100 Hz) measured in point A of FIG. 2(*a*). This means that the signal to noise ratio (SNR) may be slightly worse in the vicinity of point C (as compared to point "A"), but the advantages in terms of frequency response may be more important in some applications.

More specifically, if the sensor device is located in the "sweet zone", the relation between the gradient signal ΔBz and the amplitude of the AC current is substantially constant, irrespective of the frequency of the AC current, at least for frequencies in the range from about 100 Hz to about 2000 Hz. This means, for example, that the measurement of a pure sinusoidal AC current having a single frequency chosen in the range from 100 Hz to 2000 Hz will typically have at least the same accuracy as the system 100 of FIG. 1, provided that the system of FIG. 1 would use the correct attenuation factor for that particular frequency, but the system of FIG. 2 does not need to know the frequency, nor does it need to apply different attenuation factors for different frequencies.

But probably more importantly, the discovery underlying the present invention, and the solution proposed by the present invention based on that discovery, also means that an AC current having a waveform with many harmonics, for example a block wave (also known as "square wave"), or a triangular wave, or even non-periodic waveforms having multiple harmonics, will be measured with an improved accuracy. The reader not familiar with the terms "harmonics" and "Fourier analysis" can refer for example to https://en.wikipedia.org/wiki/Square_wave, for more information.

Besides the improved accuracy, the measurement of the present invention moreover requires only minimal processing power (no DFT, no FFT, or spectral analysis, no powerful processor or RAM are required) and only minimal delay (typically a single sample period), allowing the current to be sampled at very high frequency. Indeed, the momentary amplitude of the AC current can be determined almost instantly, by measuring the magnetic field components Bz1 and Bz2, by calculating a difference (or gradient) of these signals, and by multiplying this difference with a predefined constant factor K, which is independent of the frequency (or frequencies) of the current.

As will be explained further, the boundaries of the "sweet zone" depend on the required precision, and the area of the sweet zone will decrease as the required precision increases.

FIG. 4(*a*) shows simulation results for a sensor system as shown in FIG. 3(*c*), having a busbar with a rectangular cross section, conducting a sinusoidal current having a frequency of 2000 Hz. The upper graph shows the attenuation deviation (in %), and the lower graph shows the phase shift (in degrees), for various positions as defined by the parameters Zs and Xs.

As can be seen in the legend, the dashed curve (indicated by a black square) of the upper graph shows positions where the attenuation variation is 0%, i.e. where the amplitude of the signal ΔBz (at 2000 Hz) is equal to the amplitude ΔBz (at 100 Hz) measured at the same location. The full curves (indicated by a black triangle) show locations where the attenuation deviation is +2% or −2%, meaning locations where the amplitude of the signal ΔBz (at 2000 Hz) deviates by +2% or −2% relative to the amplitude of the signal ΔBz (at 100 Hz) measured at the same location. The (white colored) area between the curves with the triangles are positions where the attenuation variation is smaller than 2% in absolute value.

Likewise, the dashed curve (with the black square) of the lower graph shows locations where the phase of the signal ΔBz (at 2000 Hz) is 0°; and the full curves (with the triangles) show locations where the phase of the signal ΔBz (at 2000 Hz) deviates by +2° or −2° measured at the same location.

If, for example, the sensor device is chosen to be located at a distance Z=5.0 mm from the busbar, the ideal X-position where the attenuation deviation=0% is situated at the location indicated by the white square (on top of the black arrow), which is located approximately at ds=78% from the right side of the busbar. The ideal X-position where the phase shift=0° is situated at the location indicated by a white circle (on top of the black arrow), which is located approximately at ds=81% from the right side of the busbar. These ideal X-positions are not exactly the same, but they only differ by 3%, thus they are very close to each other.

In practice, of course, the sensor device can only be located in one position.

As an example, if the reference point R of the sensor device is situated at the position of the white circle, the phase shift is 0°, and the attenuation deviation is approximately equal to +1%.

As another example, if the reference point R of the sensor device is situated at the position of the white square, the attenuation deviation is 0%, and the phase shift is approximately equal to −1°. These are both very suitable positions for positioning the sensor device.

But of course, the present invention is not limited to sensor systems where the attenuation deviation is at most ±1% and the phase shift is at most ±1°, but the invention also works for slightly larger tolerance margins, for example ±2% and ±2°, or ±3% and ±3°, or ±4% and ±4°.

Referring back to FIG. 4(*a*), the X-positions (at Z=5.0 mm) where both the phase shift is less than a given tolerance margin (e.g. ±2°) and the attenuation deviation is less than a given tolerance margin (e.g. ±2%), referred to herein as the "combined ±2% and ±2° region" is indicated by a black arrow, and is located at ds-values from about 76% to about 86% of the width W of the busbar, i.e. at locations where ds is a value from about 3.80 mm to about 4.30 mm from the side of the busbar.

For comparison, also the "combined ±1% and ±1° region" (at Z=5.0 mm) is indicated by a small black arrow. This corresponds to ds-values ranging from about 79% to about 84% of the Width of the busbar, i.e. for ds-values in the range from about 3.95 mm to about 4.20 mm from the side of the busbar.

But of course, the present invention is not limited to sensor systems where the first distance Z is 5.0 mm, and the sensor device can also be located at other distances from the busbar, e.g. at a distance Zs in the range from about 0.1 mm to about 5.0 mm, or in the range from about 0.5 mm to about 4.5 mm, or at a distance Zs in the range from about 1.0 mm to about 4.0 mm. For each chosen Z-value, a range of X-values (or ds-values) where the attenuation is substantially constant within a first tolerance margin (e.g. ±4%) and/or the phase is substantially constant within a second tolerance margin (e.g. ±4°) can be found by means of these simulation curves.

FIG. 4(b) to FIG. 4(e) show similar graphs as FIG. 4(a) for a busbar having a width of W=6 mm, W=7 mm, W=8 mm and W=10 mm respectively. The same principles apply, but of course, the curves are different, and thus the locations are slightly different. As can be seen, the (white color) regions where the attenuation deviation is close to 0% and the (white color) regions where the phase shift is close to 0° have a "banana shape", which is quite narrow close to the busbar (small Z-value), and typically bending outwards and widening for increasing Z (i.e. larger distance from the busbar).

In FIG. 4(b) the X-position where the phase shift is 0° is indicated by a white circle. If the sensor is located at Z=5 mm, the attenuation deviation will be approximately +1%.

In FIG. 4(c) the X-position where the phase shift is 0° is again indicated by a white circle. If the sensor is located at Z=5 mm, the attenuation deviation will be approximately +2%. It may be better to shift the sensor device somewhat closer to the middle, to slightly decrease the attenuation deviation, at the expense of a slight increase of the phase shift.

As can be appreciated from FIG. 4(b) and FIG. 4(c) there is still a considerable overlap of the ±2% attenuation region and the ±2° phase shift region, i.e. between the curves with triangles of the upper graph and the lower graph, for various Z-positions.

Figures 4, 4D, 4E:
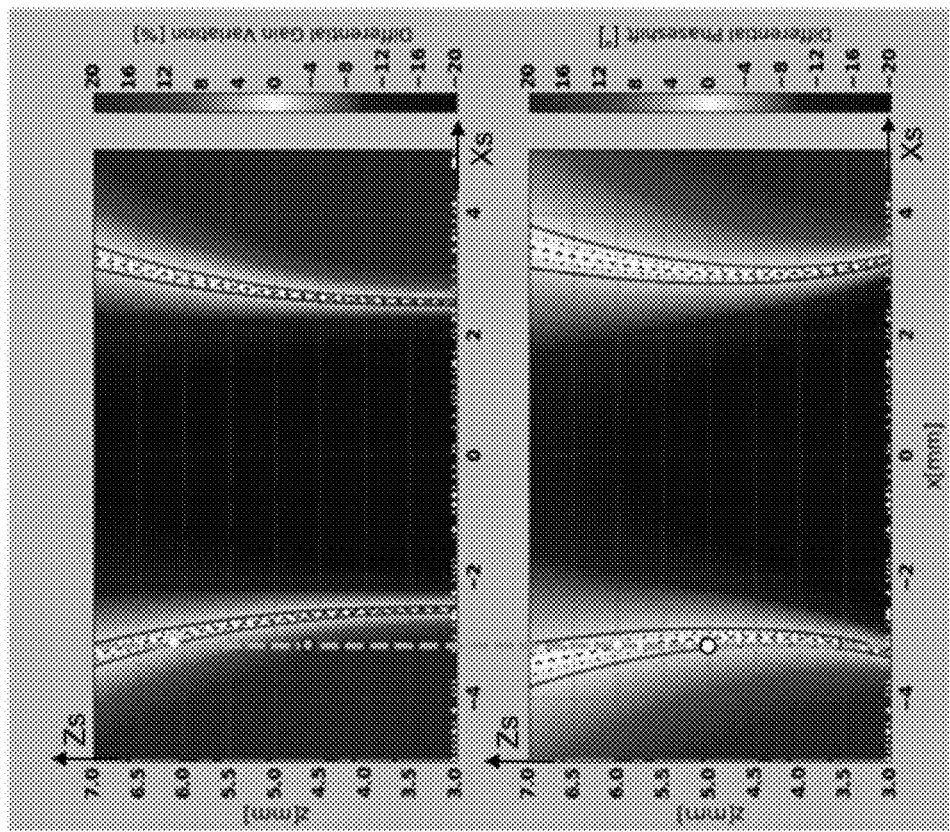

Things become slightly different in FIG. 4(d). As can be seen, when Z=5.0 mm, if the sensor is located with its reference point "R" at the location of the white circle (where the phase shift is 0°), the attenuation will deviate outside the ±2% region, but such a sensor system still provides an excellent AC response which is much more accurate than prior art solutions. There are several options. One option is to maintain this Z and X-position and allow a somewhat larger tolerance margin. Another option is to maintain the Z-position, but shift the X-position slightly inwards, to the location of the diamond. This will slightly increase the phase shift, but the attenuation deviation will shift into the "±2% tolerance region". Yet another option is to choose a larger Z-position, for example Z=5.5 mm.

As can be appreciated from FIG. 4(e), locating the reference point R of the sensor device at Z=5.0 mm, and at the location where the phase shift is equal to 0° causes a relatively large attenuation deviation (in the order of about 10%). Based on the graph of FIG. 4(e), it would seem better to locate the sensor such that its reference point R is located at Z=6.0 mm or higher, but in practice, at such high distance from the busbar, the signals may become relatively weak, and the SNR may become important. Thus, rather than increasing the Z-value, it may be better to increase the tolerance margins to for example ±3%, or ±4%, and keep the Z-value smaller than 5.0 mm.

The trade-off between smaller distance Zs (thus larger signal-strength, smaller SNR) versus larger attenuation and/or phase shift error, does not only apply to busbars having a width of 10 mm, but also applies to smaller busbars.

It is noted that the simulations of FIG. 4(a) to FIG. 4(e) are performed for a busbar having a thickness T=3 mm, but of course, the present invention is not limited thereto, and is also applicable for busbars having another thickness in the range from about 2.0 mm to about 5.0 mm, for example T=2.5 mm, or T=3.0 mm, or T=3.5 mm, or T=4.0 mm, or T=4.5 mm, or T=5.0 mm. Similar simulations can be performed, but not all combinations of thickness and width have to be simulated, because the magnetic field around a busbar having a thickness T=3.0 mm and a width W=6.0 mm (for example) will look the same as the magnetic field around a busbar having a thickness T=2.0 mm and a width W=4.0 mm after scaling. This means that FIG. 4(a) not only shows how the magnetic field looks around a busbar having T=3.0 mm and W=5.0 mm, but also shows how the magnetic field looks around a busbar with T=2.0 mm and W=3.33 mm; or around a busbar with T=4.0 mm and W=6.67 mm, or around a busbar with T=6.0 mm and W=10.0 mm, etc.

It is furthermore noted that the simulations of FIG. 2(a) to FIG. 2(c) and FIG. 4(a) to FIG. 4(e) are performed for a predefined distance dx between the magnetic sensor elements of about 2.2 mm, but the present invention is not limited thereto, and the invention will also work for other distances, e.g. distances in the range from 0.5 mm to 4.0 mm, or in the range from 1.0 mm to 3.0 mm, or in the range from 1.5 mm to 2.5 mm, e.g. equal to about 1.5 mm, or equal to about 1.6 mm, or equal to about 1.7 mm, or equal to about 1.8 mm, or equal to about 1.9 mm, or equal to about 2.0 mm, or equal to about 2.1 mm, or equal to about 2.2 mm, or equal to about 2.3 mm. As a rule of thumb, a larger distance dx typically causes a larger magnitude of the differential signal |ΔBz|, thus will typically yield a slightly better signal-to-noise ratio (SNR) but requires a larger chip. A trade-off can be made between accuracy and cost.

In each case, the skilled person having the benefit of the present disclosure, can easily perform simulations like those described above, to find an optimal position for other parameters, for example for another value of dx.

FIG. 5 shows a table corresponding to the graphs of FIG. 4(a) to FIG. 4(e), showing the ideal lateral position of the sensor device for achieving 0% attenuation variations, and the ideal position for achieving 0° phase shift, for a distance Zs of 3, 4 or 5 mm from the busbar. As can be seen, these ideal positions are not exactly the same, but are located close to each other.

From FIG. 4(a) to FIG. 4(d) it can be appreciated that the present invention provides an excellent AC behaviour especially for busbars having an aspect ratio W/T in the range from about 1.67 to about 2.67, but the present invention is not limited hereto, and will also provide a very good AC behaviour, or simply a good AC behaviour for busbars having an aspect ratio W/T higher than 2.67, or smaller than 1.67. As already suggested above, the skilled person can make a trade-off (or compromise) between (i) large signal strength (small Zs) but slightly larger error on the one hand, and (ii) smaller signal strength (larger Zs) but smaller error. This is especially true for busbars having a W/T ratio smaller than 1.67 or larger than 2.67. It is noted in this respect, that the present invention also encompasses busbars having a width W in the range from 3.0 mm to 12.0 mm, for example having a width W=3.0 mm, or W=3.5 mm, or W=4.0 mm, or W=4.5 mm, or W=11 mm, or W=12 mm.

While the principles of the present invention are illustrated and explained above in sufficient detail for a skilled person to work the invention, the graphs of FIG. 4(a) to FIG. 4(e) may not the best way to clearly define the scope of protection. The inventors performed additional simulations, for Z-values ranging from 0.5 to 4.0 mm and combined the 0% attenuation deviation curves for various W in a single graph (see FIG. 6(a), FIG. 7(a), FIG. 8(a) and FIG. 9(a)) as a function of the parameters Zs and ds. Likewise, the 0° phase shift curves for various W are combined in a single graph (see FIG. 6(b), FIG. 7(b), FIG. 8(b) and FIG. 9(b)) as a function of the parameters Zs and ds. These graphs allow to better define the scope of protection by means of rectangular regions, which is practical to describe, and to verify.

Figures 6, 6A:
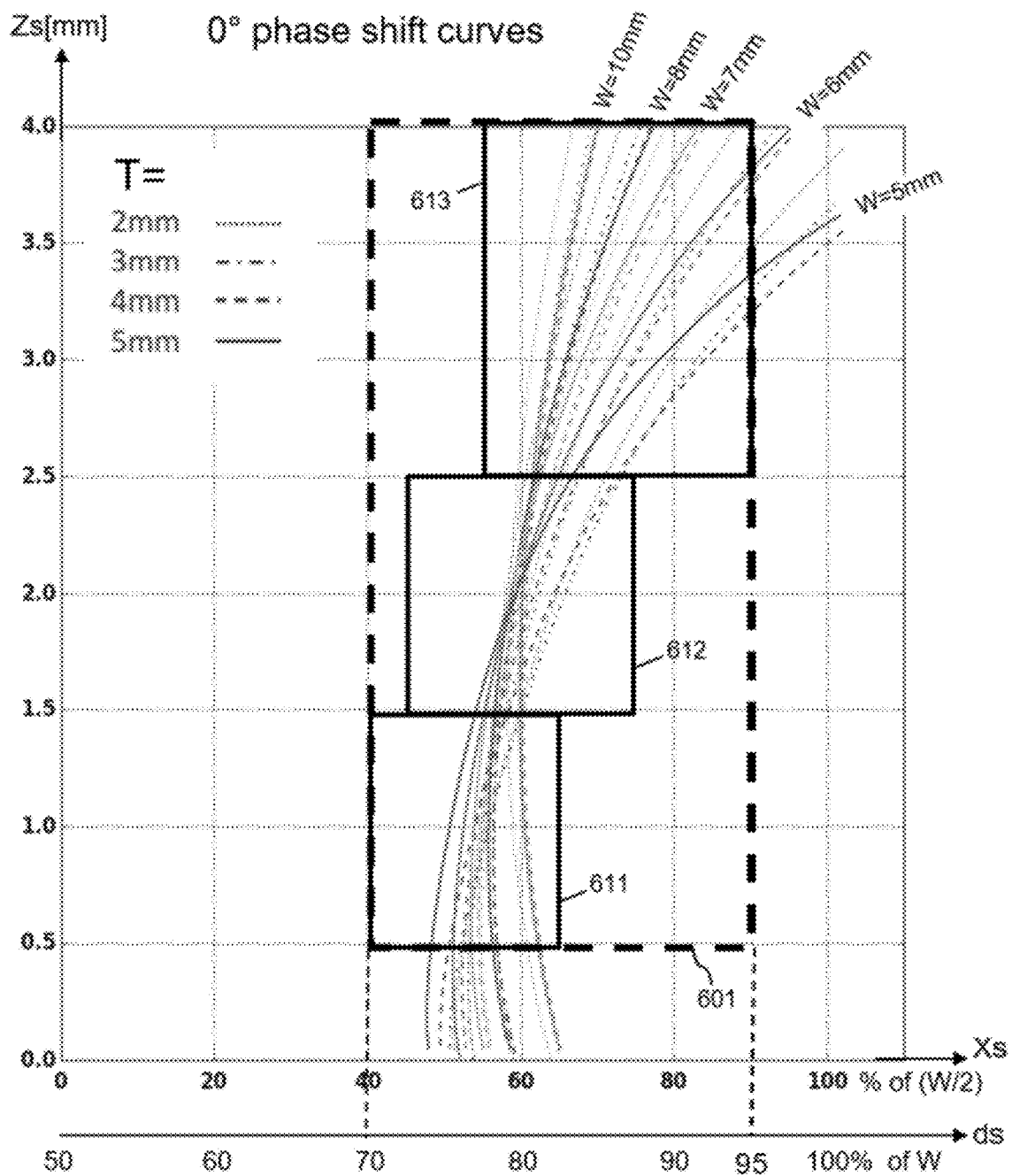
FIG. 6, including
FIGS. 6(a) and 6(b), 6(a) shows "0° phase shift curves"
Figures 6, 6B:
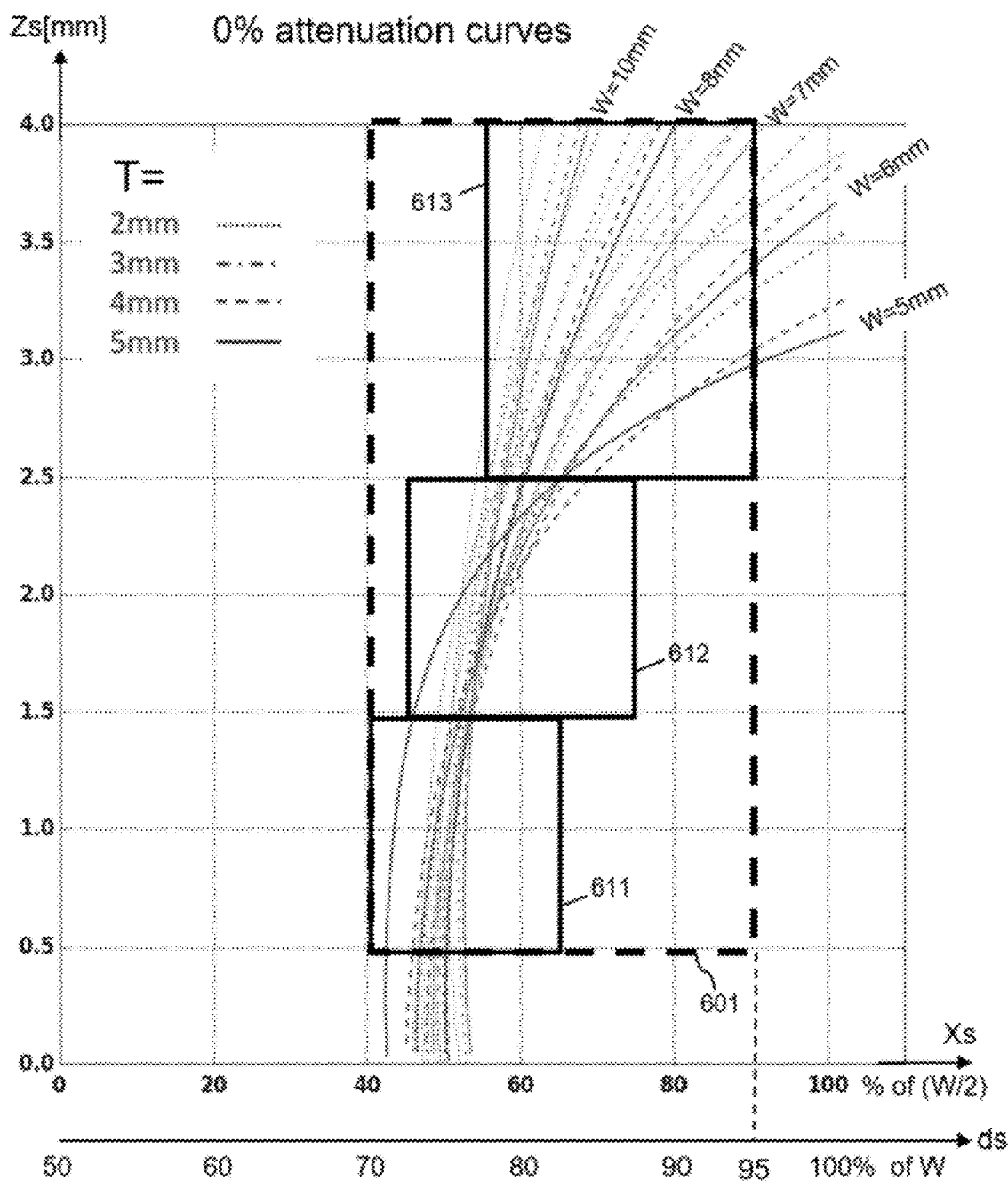

FIG. 6(a) shows "0° phase shift curves", and FIG. 6(b) shows "0% attenuation deviation curves" for busbars having a width W varying from 5 mm to 10 mm and having a thickness T ranging from 2 mm to 5 mm (as indicated in the legend), for various distances Zs from the busbar varying from 0.0 mm to 4.0 mm and lateral positions Xs (or ds).

Four preferred rectangular regions 601, 611, 612, 613 are indicated. According to embodiments of the present invention, a reference point of the sensor device as defined above, is to be located in one of these rectangular zones. Since multiple parameters are involved, the following table explicitly lists combinations of parameters for these regions.

TABLE 1a combination of parameters of preferred embodiments shown in FIG. 6(a) and FIG. 6(b)

| Zs [mm] | dx [mm] | W [mm] | T [mm] | ds [% of W] | zone |
|---|---|---|---|---|---|
| 0.5 to 4.0 | 0.5 to 2.5 | 5.0 to 10.0 | 2.0 to 5.0 | 70% to 95% | 601 |
| 0.5 to 3.5 | 0.5 to 2.5 | 5.0 to 10.0 | 2.0 to 5.0 | 70% to 95% | part of 601 |
| 0.5 to 1.5 | 0.5 to 2.5 | 5.0 to 10.0 | 2.0 to 5.0 | 70% to 83% | 611 |
| 1.5 to 2.5 | 0.5 to 2.5 | 5.0 to 10.0 | 2.0 to 5.0 | 72% to 88% | 612 |
| 2.5 to 4.0 | 0.5 to 2.5 | 5.0 to 10.0 | 2.0 to 5.0 | 77% to 95% | 613 |
| 0.5 to 4.0 | 1.0 to 2.5 | 5.0 to 10.0 | 2.0 to 5.0 | 70% to 95% | 601 |
| 0.5 to 3.5 | 1.0 to 2.5 | 5.0 to 10.0 | 2.0 to 5.0 | 70% to 95% | part of 601 |
| 0.5 to 1.5 | 1.0 to 2.5 | 5.0 to 10.0 | 2.0 to 5.0 | 70% to 83% | 611 |
| 1.5 to 2.5 | 1.0 to 2.5 | 5.0 to 10.0 | 2.0 to 5.0 | 72% to 88% | 612 |
| 2.5 to 4.0 | 1.0 to 2.5 | 5.0 to 10.0 | 2.0 to 5.0 | 77% to 95% | 613 |
| 0.5 to 4.0 | 1.5 to 2.5 | 5.0 to 10.0 | 2.0 to 5.0 | 70% to 95% | 601 |
| 0.5 to 3.5 | 1.5 to 2.5 | 5.0 to 10.0 | 2.0 to 5.0 | 70% to 95% | part of 601 |
| 0.5 to 1.5 | 1.5 to 2.5 | 5.0 to 10.0 | 2.0 to 5.0 | 70% to 83% | 611 |
| 1.5 to 2.5 | 1.5 to 2.5 | 5.0 to 10.0 | 2.0 to 5.0 | 72% to 88% | 612 |
| 2.5 to 4.0 | 1.5 to 2.5 | 5.0 to 10.0 | 2.0 to 5.0 | 77% to 95% | 613 |

In fact, as mentioned above, for some envisioned embodiments, the reference point R may be located substantially near the edge of the busbar (e.g. ds=100%), or even slightly beyond the edge (e.g. ds=110%). In its broadest form, the present invention can therefore be described by the following set of parameters (see table 1b).

It is noted that the value of T has to be chosen smaller than or equal to W. Thus W=3.0 to 10.0 mm and T=2.0 to 5.0 mm means in fact that, if W=3.0 mm, then T=2.0 to 3.0 mm; and if W=4.0 mm, then T=2.0 to 4.0 mm; if W=6.5 mm, then T=2.0 to 5.0 mm. This is indicated by "T≤V" in the table header.

TABLE 1b combination of parameters of embodiments according to the present invention.

| Zs [mm] | dx [mm] | W [mm] | T [mm], but T ≤ W | ds [% of W] | zone |
|---|---|---|---|---|---|
| 0.5 to 4.0 | 0.5 to 2.5 | 3.0 to 10.0 | 2.0 to 5.0 | 70% to 110% | (not indicated) |
| 0.5 to 4.0 | 0.5 to 2.5 | 4.0 to 10.0 | 2.0 to 5.0 | 70% to 110% | (not indicated) |

Figures 7, 7A:
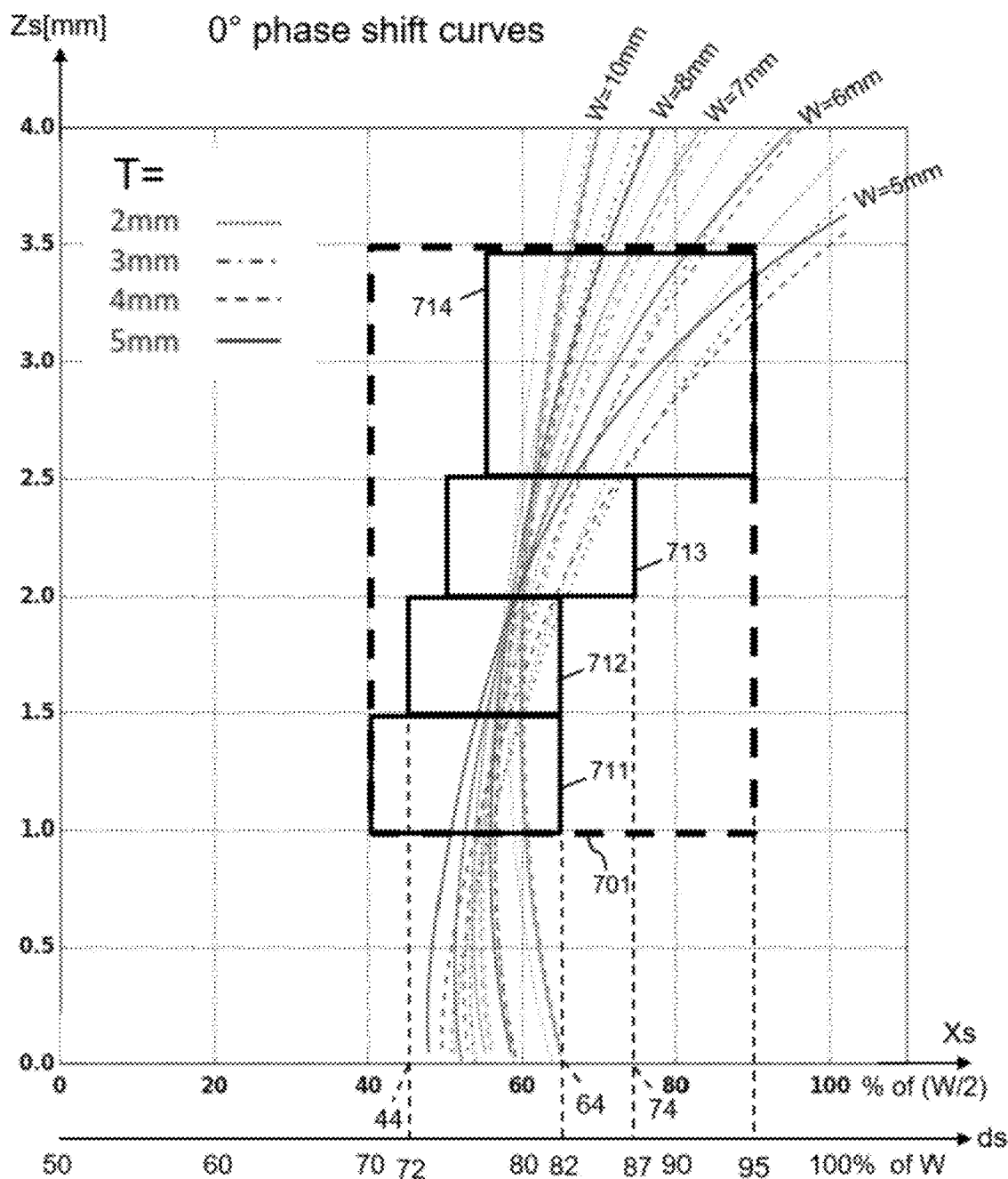
FIG. 7, including
FIG. 7(a) and FIG. 7(b), show the same plots as FIG. 6(a) and FIG. 6(b) respectively, with smaller "preferred regions" where a reference point of the sensor device is to be located according to embodiments of the present invention.
Figures 7, 7B:
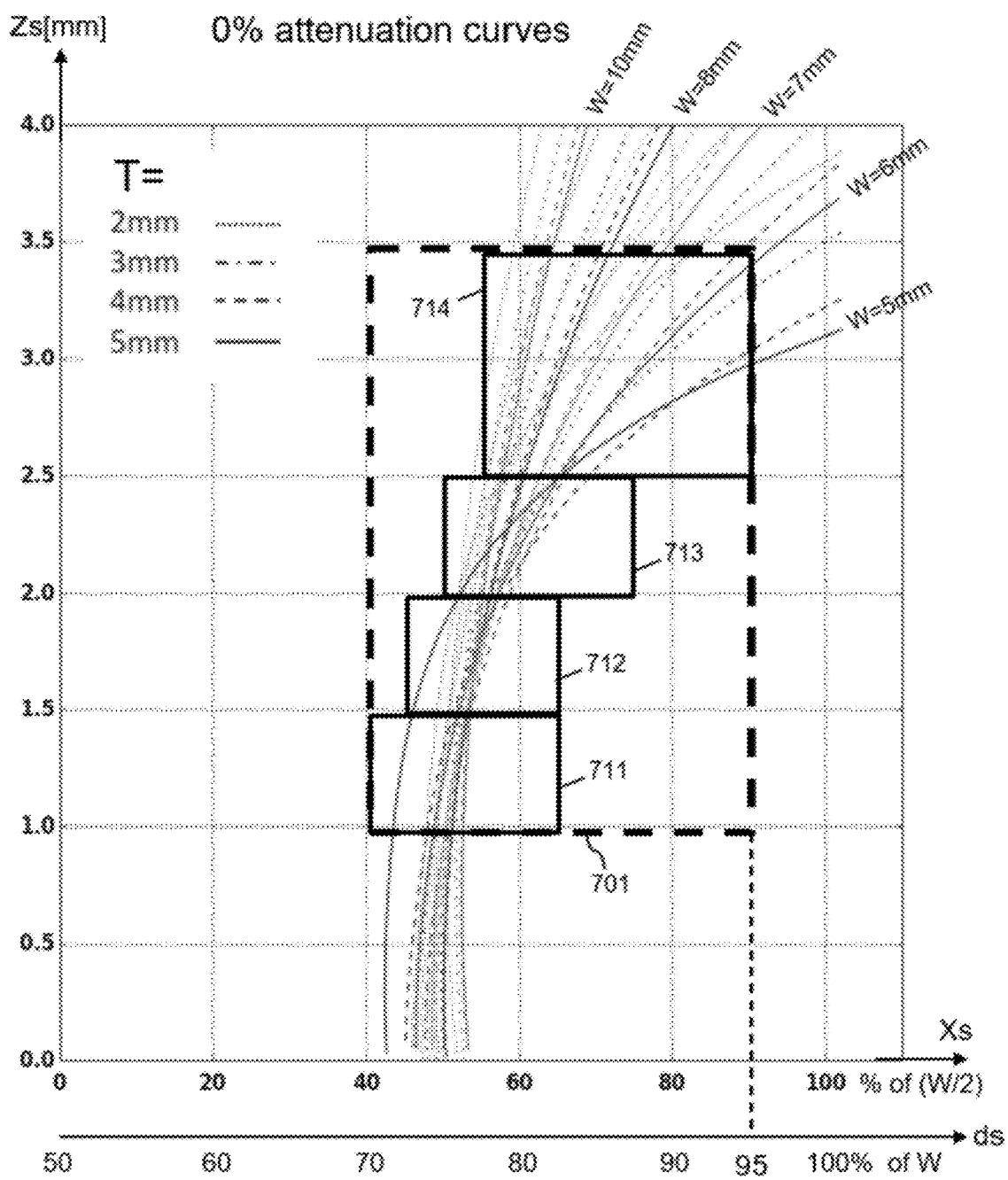

FIG. 7(a) and FIG. 7(b) show the same plots as FIG. 6(a) and FIG. 6(b) respectively, overlaid by smaller rectangular regions 701, 711, 712, 713, 714 of where a reference point R of the sensor device is to be located, according to embodiments of the present invention. The following table explicitly lists combinations of parameters for these regions.

TABLE 2 combination of parameters of preferred embodiments shown in FIG. 7(a) and FIG. 7(b)

| Zs [mm] | dx [mm] | W [mm] | T [mm] | ds [% of W] | zone |
|---|---|---|---|---|---|
| 1.0 to 3.5 | 0.5 to 2.5 | 5 to 10 | 3 to 5 | 70% to 95% | 701 |
| 1.0 to 1.5 | 0.5 to 2.5 | 5 to 10 | 3 to 5 | 70% to 83% | 711 |
| 1.5 to 2.0 | 0.5 to 2.5 | 5 to 10 | 3 to 5 | 72% to 83% | 712 |
| 2.0 to 2.5 | 0.5 to 2.5 | 5 to 10 | 3 to 5 | 75% to 88% | 713 |
| 2.5 to 3.5 | 0.5 to 2.5 | 5 to 10 | 3 to 5 | 77% to 95% | 714 |
| 1.0 to 3.5 | 1.0 to 2.5 | 5 to 10 | 3 to 5 | 70% to 95% | 701 |
| 1.0 to 1.5 | 1.0 to 2.5 | 5 to 10 | 3 to 5 | 70% to 83% | 711 |
| 1.5 to 2.0 | 1.0 to 2.5 | 5 to 10 | 3 to 5 | 72% to 83% | 712 |
| 2.0 to 2.5 | 1.0 to 2.5 | 5 to 10 | 3 to 5 | 75% to 88% | 713 |
| 2.5 to 3.0 | 1.0 to 2.5 | 5 to 10 | 3 to 5 | 77% to 95% | 714 |
| 1.0 to 3.5 | 1.5 to 2.5 | 5 to 10 | 3 to 5 | 70% to 95% | 701 |
| 1.0 to 1.5 | 1.5 to 2.5 | 5 to 10 | 3 to 5 | 70% to 83% | 711 |
| 1.5 to 2.0 | 1.5 to 2.5 | 5 to 10 | 3 to 5 | 72% to 83% | 712 |
| 2.0 to 2.5 | 1.5 to 2.5 | 5 to 10 | 3 to 5 | 75% to 88% | 713 |
| 2.5 to 3.0 | 1.5 to 2.5 | 5 to 10 | 3 to 5 | 77% to 95% | 714 |

Figures 8, 8A:
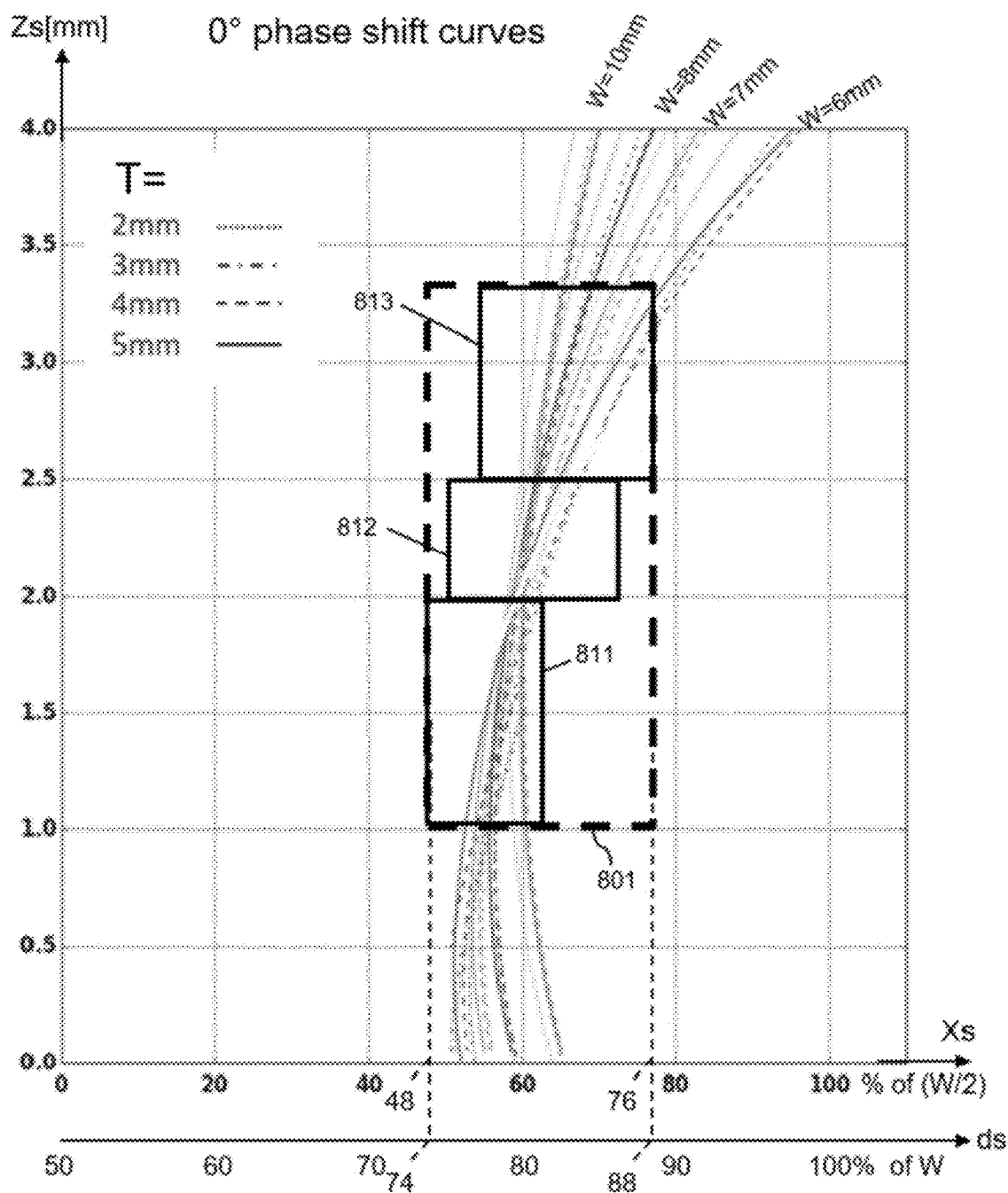
FIG. 8, including
FIG. 8(a) and FIG. 8(b), show a subset of the plots of FIG. 6(a) and FIG. 6(b), for busbar widths from 6 to 10 mm, and smaller "preferred regions" where a reference point of the sensor device is to be located according to embodiments of the present invention.
Figures 8, 8B:
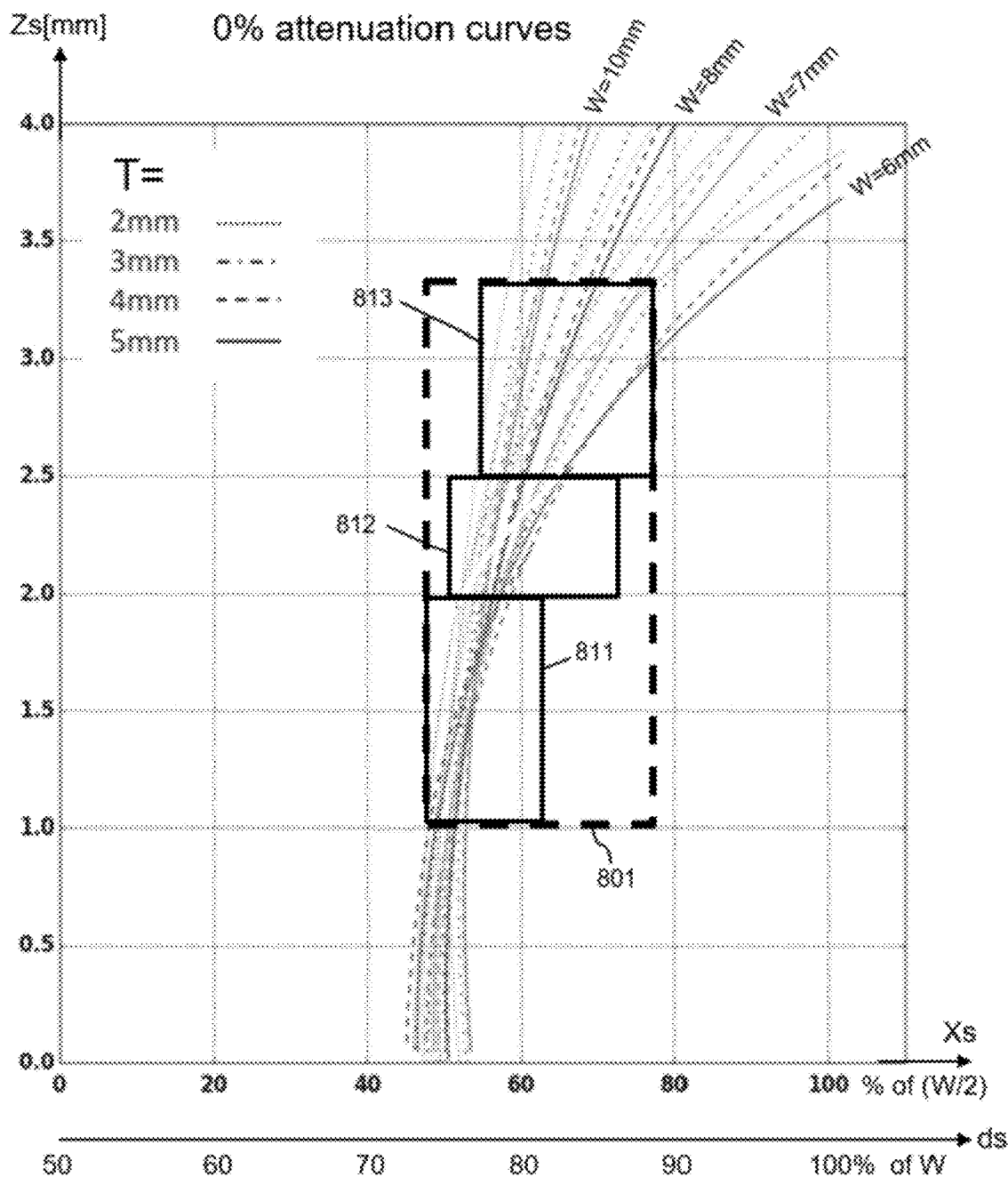

FIG. 8(a) and FIG. 8(b) show a subset of the plots of FIG. 6(a) and FIG. 6(b), for busbar widths from 6 to 10 mm, overlaid by smaller rectangular regions 801, 811, 812, 813 of where a reference point R of the sensor device is to be located, according to embodiments of the present invention.

The following table explicitly lists combinations of parameters for these regions.

TABLE 3 combination of parameters of preferred embodiments shown in FIG. 8(a) and FIG. 8(b)

| Zs [mm] | dx [mm] | W [mm] | T [mm] | ds [% of W] | zone |
|---|---|---|---|---|---|
| 1.0 to 3.3 | 0.5 to 2.5 | 6 to 10 | 3 to 5 | 74% to 88% | 801 |
| 1.0 to 2.0 | 0.5 to 2.5 | 6 to 10 | 3 to 5 | 74% to 81% | 811 |
| 2.0 to 2.5 | 0.5 to 2.5 | 6 to 10 | 3 to 5 | 75% to 86% | 812 |
| 2.5 to 3.3 | 0.5 to 2.5 | 6 to 10 | 3 to 5 | 77% to 88% | 813 |
| 1.0 to 3.3 | 1.0 to 2.5 | 6 to 10 | 3 to 5 | 74% to 88% | 801 |
| 1.0 to 2.0 | 1.0 to 2.5 | 6 to 10 | 3 to 5 | 74% to 81% | 811 |
| 2.0 to 2.5 | 1.0 to 2.5 | 6 to 10 | 3 to 5 | 75% to 86% | 812 |
| 2.5 to 3.3 | 1.0 to 2.5 | 6 to 10 | 3 to 5 | 77% to 88% | 813 |
| 1.0 to 3.3 | 1.5 to 2.5 | 6 to 10 | 3 to 5 | 74% to 88% | 801 |
| 1.0 to 2.0 | 1.5 to 2.5 | 6 to 10 | 3 to 5 | 74% to 81% | 811 |
| 2.0 to 2.5 | 1.5 to 2.5 | 6 to 10 | 3 to 5 | 75% to 86% | 812 |
| 2.5 to 3.3 | 1.5 to 2.5 | 6 to 10 | 3 to 5 | 77% to 88% | 813 |

Figures 9, 9A:
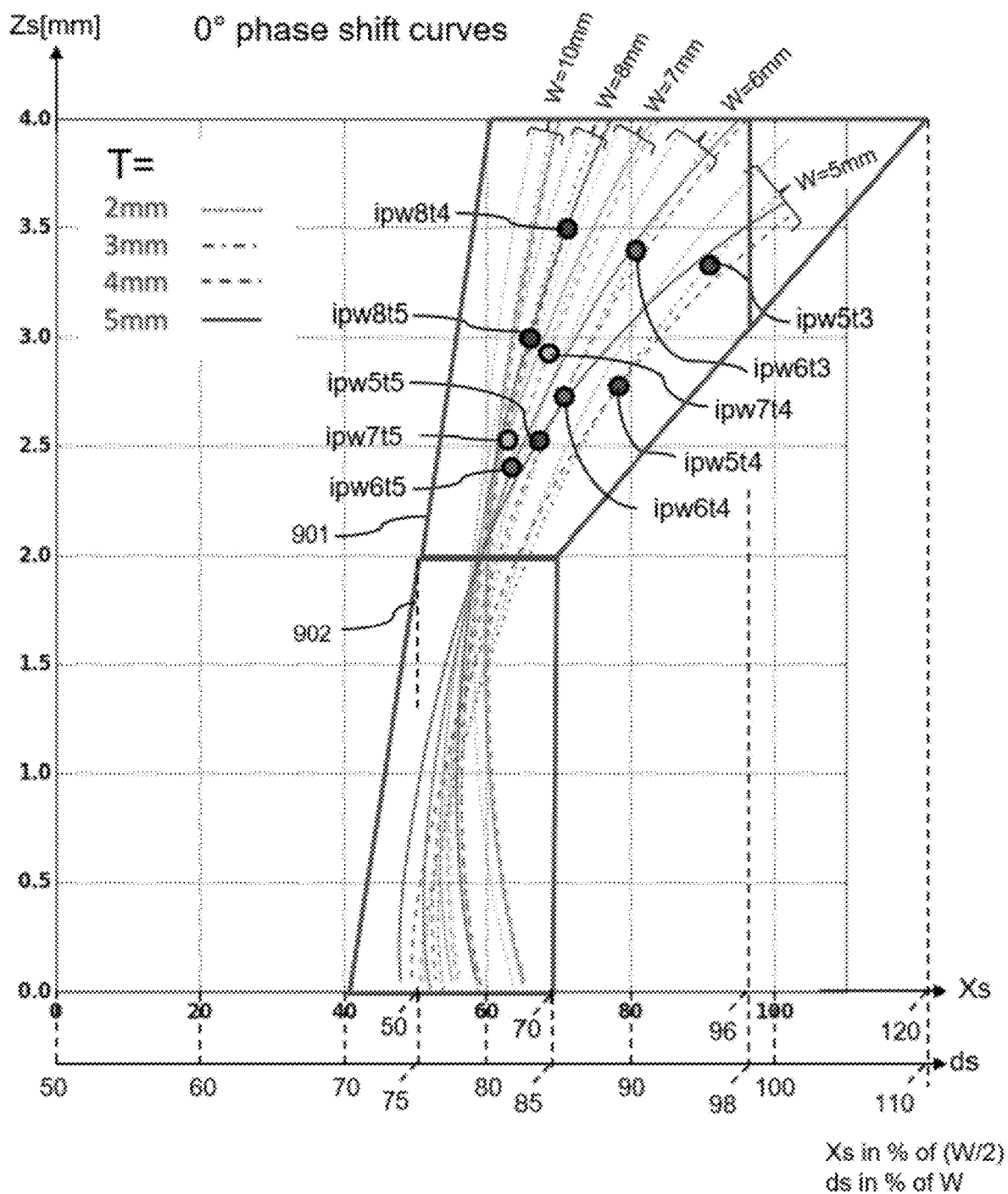
FIG. 9, including
FIG. 9(a) and FIG. 9(b), show the plots of FIG. 6(a) and FIG. 6(b), and show the location of exemplary "sweet spots" where the attenuation deviation is 0% and the phase shift is 0° for certain busbars having a thickness T from 2 to 5 mm and a width W from 5 to 10 mm, and shows a narrow "region" around some of the sweet spots where a reference point of the sensor device is to be located according to some embodiments of the present invention.
Figures 9, 9B:
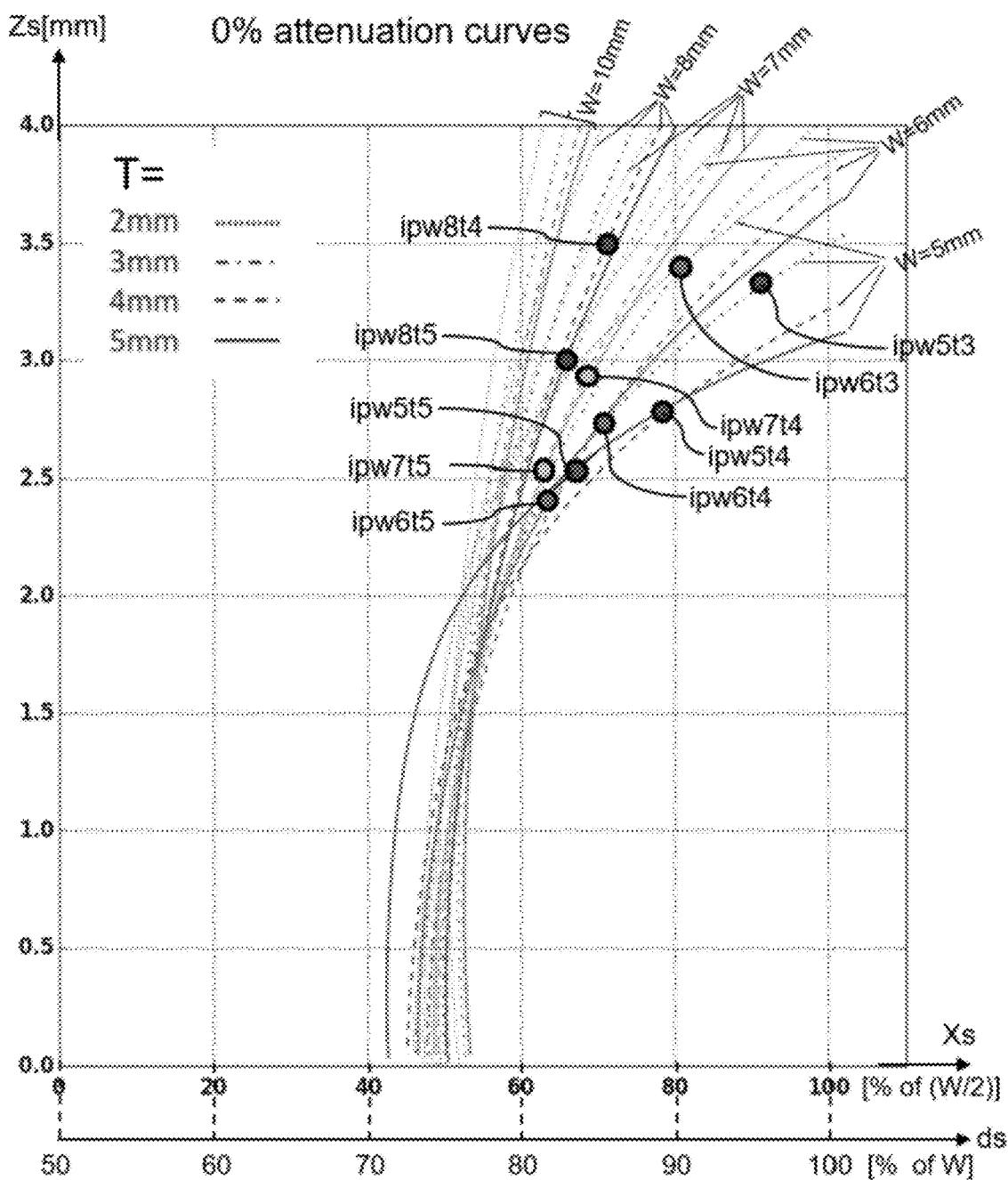

FIG. 9(a) and FIG. 9(b) show the plots of FIG. 6(a) and FIG. 6(b), for busbar widths from 5 to 10 mm, and in addition show the locations of several exemplary "sweet spots" where the attenuation deviation is 0% and the phase shift is 0°. These "sweet spots" can be found, for a busbar having a particular thickness T and a particular width W, at the intersection of the attenuation deviation curve and the phase shift curve. (e.g. by overlapping the drawing of FIG. 9(a) and the drawing of FIG. 9(b)). The label of point "ipw6t5" stands for "intersection point for W=6 mm and T=5 mm", etc.

It is explicitly pointed out, however, that it is not required to position the sensor device exactly in the sweet spot in order to obtain good AC response. Indeed, for many applications, an attenuation deviation of ±4% and a phase shift of ±4% may well be acceptable.

Also shown are an upper region 901, having a trapezoidal shape defined by interconnecting the following four points by straight lines: (ds=80%, Zs=4.0 mm), (ds=110%, Zs=4.0 mm), (ds=85%, Zs=2.0), (ds=75%, Zs=2.0 mm);
and a truncated version of this region, defined by interconnecting the following five points by straight lines: (ds=80%, Zs=4.0 mm), (ds=98%, Zs=4.0 mm), (ds=98%, Zs=3.0 mm), (ds=85%, Zs=2.0 mm), (ds=75%, Zs=2.0 mm);
and a lower region 902, having a trapezoidal shape defined by interconnecting the following four points by straight lines: (ds=70%, Zs=0.0 mm), (ds=75%, Zs=2.0 mm), (ds=85%, Zs=2.0 mm), (ds=85%, Zs=0.0 mm).

The present invention can also be expressed in terms of these regions, namely by stating that according to the principles of the present invention, the reference point "R" of the sensor device is to be located in any of these shapes; or in "close vicinity" of the sweet spots shown in FIG. 9(a), for example at a position deviating at most ±1.0 mm in the X and/or Z-direction from the 0% and 0° positions; or at a position deviating at most ±0.75 mm in the X and/or Z-direction from the 0% and 0° positions; or at a position deviating at most ±0.5 mm in the X and/or Z-direction from the 0% and 0° positions; or at a position deviating at most ±0.3 mm in the X and/or Z-direction from the 0% and 0° positions.

In certain embodiments of the present invention, the distance dx and the position of the reference point are chosen such that both sensor elements H1, H2 are located "above" the busbar. This may be added as an additional limitation to all of the above embodiments.

In certain embodiments of the present invention, the distance dx and the position of the reference point are chosen such that one sensor elements is located "above" the busbar, while the other sensor element is located "next to" the busbar. This may be added as an additional limitation to all of the above embodiments.

With "above the busbar" is meant that a projection of the position of the magnetic sensor element in the direction of the Z-axis (see FIG. 3(b) and FIG. 3(c)) intersects the busbar. With "next to the busbar" is meant that a projection of the position of the magnetic sensor element in the direction of the Z-axis (see FIG. 3(b) and FIG. 3(c)) does not intersect the busbar.

Whether the two sensors are located "above" the busbar or not, can easily be verified by means of the parameters dx, W, and ds. A few examples are given in the following table (this list is not exhaustive):

TABLE 5 exemplary combinations of parameters to indicate whether the two sensor elements are located "above" the busbar, or "next to" the busbar, or "on the edge" of the busbar,

| dx [mm] | W [mm] | ds [mm] | d1 = ds − (dx/2) [mm] | d2 = Xs + dx/2 [mm] | above busbar? |
|---|---|---|---|---|---|
| 1.0 | 5.0 | @75% W = 3.75 | 3.75 − 0.5 = 3.25 | 3.75 + 0.5 = 4.25 | both above |
| 1.0 | 5.0 | @80% W = 4.0 | 4.0 − 0.5 = 3.5 | 4.0 + 0.5 = 4.5 | both above |
| 1.0 | 5.0 | @95% W = 4.75 | 4.75 − 0.5 = 4.25 | 4.75 + 0.5 = 5.25 | 1 above, 1 next to |
| 1.0 | 6.0 | @80% W = 4.8 | 4.8 − 0.5 = 4.3 | 4.8 + 0.5 = 5.3 | both above |
| 1.0 | 10.0 | @80% W = 4.8 | 8.0 − 0.5 = 7.5 | 8.0 + 0.5 = 8.5 | both above |
| 2.0 | 5.0 | @75% W = 3.75 | 3.75 − 1.0 = 2.75 | 3.75 + 1.0 = 4.75 | both above |
| 2.0 | 5.0 | @80% W = 4.0 | 4.0 − 1.0 = 3.0 | 4.0 + 1.0 = 5.0 | 1 above, 1 on edge |
| 2.0 | 5.0 | @90% W = 4.5 | 4.5 − 1.0 = 3.5 | 4.5 + 1.0 = 5.5 | 1 above, 1 next to |
| 2.0 | 6.0 | @75% W = 4.5 | 4.5 − 1.0 = 3.5 | 4.5 + 1.0 = 5.5 | both above |
| 2.0 | 6.0 | @80% W = 4.8 | 4.8 − 1.0 = 3.8 | 4.8 + 1.0 = 5.8 | both above |
| 2.0 | 6.0 | @90% W = 5.4 | 5.4 − 1.0 = 4.4 | 5.4 + 1.0 = 6.4 | 1 above, 1 next to |
| 2.0 | 8.0 | @75% W = 6.0 | 6.0 − 1.0 = 5.0 | 6.0 + 1.0 = 7.0 | both above |
| 2.0 | 8.0 | @80% W = 6.4 | 6.4 − 1.0 = 5.4 | 6.4 + 1.0 = 7.4 | both above |
| 2.2 | 5.0 | @75% W = 3.75 | 3.75 − 1.1 = 2.65 | 3.75 + 1.1 = 4.85 | both above |
| 2.2 | 5.0 | @80% W = 4.0 | 4.0 − 1.1 = 2.9 | 4.0 + 1.1 = 5.1 | 1 above, 1 next to |
| 2.2 | 6.0 | @75% W = 4.5 | 4.5 − 1.1 = 3.4 | 4.5 + 1.1 = 5.6 | both above |
| 2.2 | 6.0 | @80% W = 4.8 | 4.8 − 1.1 = 3.7 | 4.8 + 1.1 = 5.9 | both above |
| 2.2 | 8.0 | @75% W = 6.0 | 6.0 − 1.1 = 4.9 | 6.0 + 1.1 = 7.1 | both above |
| 2.2 | 8.0 | @80% W = 6.4 | 6.4 − 1.1 = 5.3 | 6.4 + 1.1 = 7.5 | both above |

FIG. 10(a) to FIG. 10(e) show various busbars in top view. The busbar of FIG. 10(a) is a straight busbar, extending in the Y-direction. The current flows in the Y-direction. The busbar has a rectangular cross-section in a plane α substantially perpendicular to the direction of the current flow. The width W of the busbar extends in the X-direction, as indicated.

According to the present invention, the sensor device is to be oriented such that the two sensor elements are located on the X-axis, which is transverse to the direction of the current. This allows the sensor device to measure the magnetic field gradient ΔBz/Δx along the X-direction. As mentioned above, the division by Δx can be omitted. Furthermore, the sensor device is to be located such that a distance "ds" between an (imaginary) reference point "R" between the two sensor elements and an edge of the busbar is a value in the range from 70% to 110% of the width W of the busbar, or a value in the range from 70% to 95% of the width W of the busbar, or a subrange hereof, as described above, depending on the height position (Zs) of the sensor device, and depending on the desired accuracy.

But the invention is not limited to purely straight busbars and can also be applied to busbars having a single cutout or more than one cut-out, which may be applied to locally increase the current density. A few examples are shown. The busbar of FIG. 10(c) has a single cutout. The busbars of FIG. 10(b), FIG. 10(d) and FIG. 10(e) have two cut-outs on opposite sides of the busbar. Note that these drawings are not necessarily drawn to scale.

Assuming the length Lc of the cut-out is at least 3.0 mm long, and the width of the narrow portion or the effective width Wp is at least 5.0 mm, the same principles as described above remain applicable, meaning that there is a location "in a banana shaped region" where ΔBz or dBz/dx is substantially independent of frequencies, but instead of the overall width W of the busbar, a "local width" Wp is to be taken into account, and the distance "ds" is to be measured relative to a "local side" of the narrowed portion of the busbar, as indicated in these drawings.

FIG. 10(f) and FIG. 10(g) show simulation results for the busbar of FIG. 10(b) having an effective width Wp of 6 mm, and for a length Lc of the cutout ranging from 3 mm to 8 mm. The simulations shown are performed for a busbar having a thickness T of 3 mm, and for a distance dx between the sensor elements of 1.8 mm. As can be seen, "banana shaped" regions similar to the ones described above also occur in this case.

Although not shown, simulations were also performed for a busbar thickness T of 2 mm, yielding very similar results.

FIG. 11(a) shows a top view, and FIG. 11(b) shows a cross-sectional view of a portion of a busbar 1101 having two slits on opposite sides of the busbar, forming a zigzag passage for the current.

The present invention also works for this busbar 1101, in the same manner as described above, provided that the slits are sufficiently far apart from each other and are sufficiently deep (in the transverse direction X of the busbar) and are sufficiently wide (in the longitudinal direction Y of the busbar). The skilled person having the benefit of the present invention can easily find suitable slits by trial and error, or by performing simulations similar to those described above.

Near the position of the sensor device, the current I flows in the direction X. The busbar has a rectangular cross section (see FIG. 11(b)) in a cross-sectional plane α perpendicular to the direction of the current. This rectangular cross section defines a thickness T of the busbar and an effective width Wp. According to the principles of the present invention, the AC current flowing through the busbar can be measured with high or improved accuracy by orienting the sensor device such that the two sensor elements are located on a virtual line oriented in the Y-direction, and such that an imaginary reference point R in the middle between the two sensor elements is located at a distance "ds" from a side of the busbar, where "ds" is a value in the range from 70% to 110% or from 70% to 95% of the effective width Wp, or a subrange hereof (depending on the height position Zs). The exact position can be fine-tuned, by taking into account e.g. the distance Zs from the busbar, the Thickness T, and the maximum tolerance margin for the attenuation deviation and phase shift.

Figure 11:
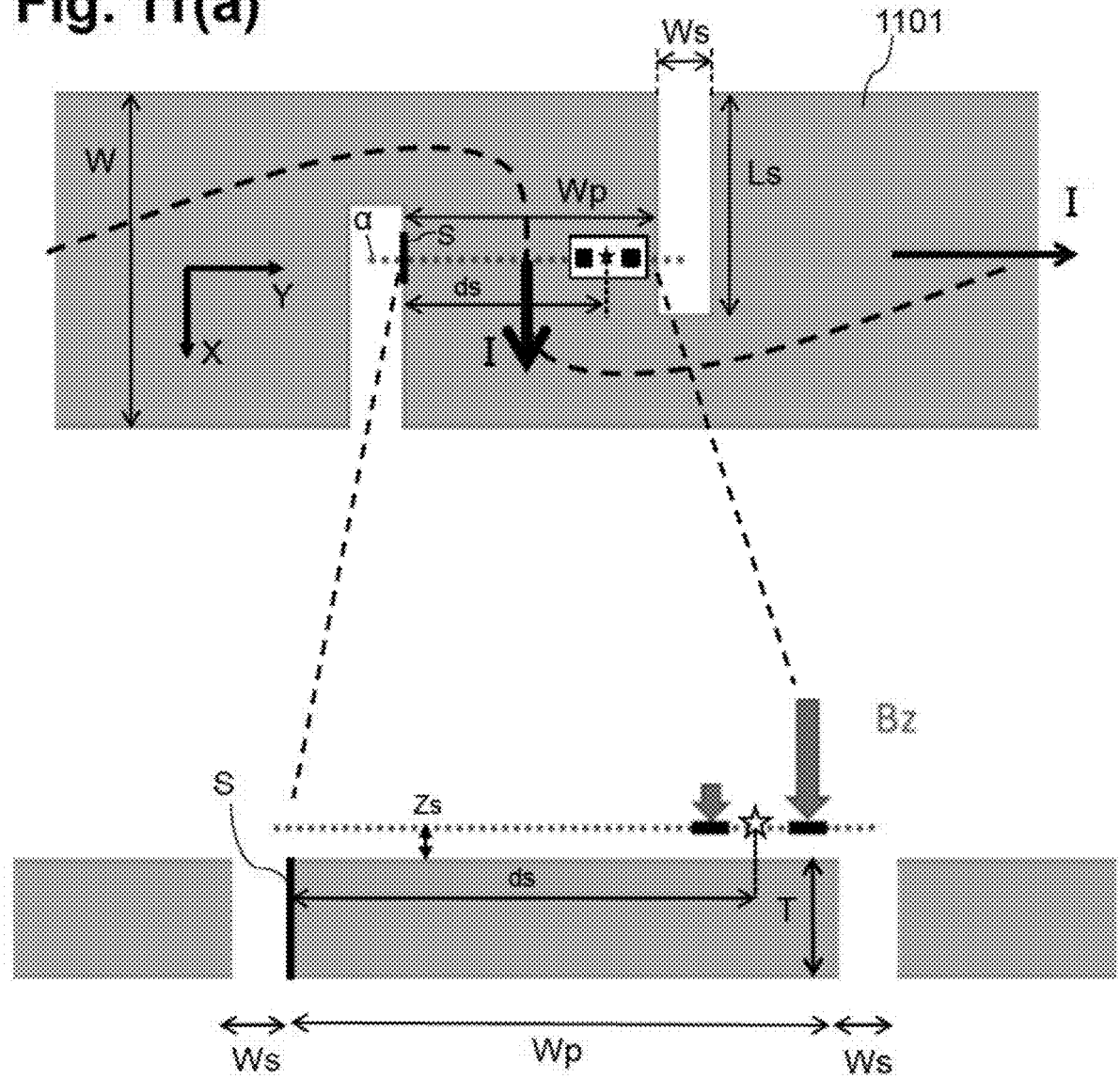
FIG. 11, including

FIG. 12(a) to FIG. 12(c) show simulation results similar to those of FIG. 2(a) to FIG. 2(c), but for the busbar of FIG. 11, having two slits forming a zigzag.

Figure 13:
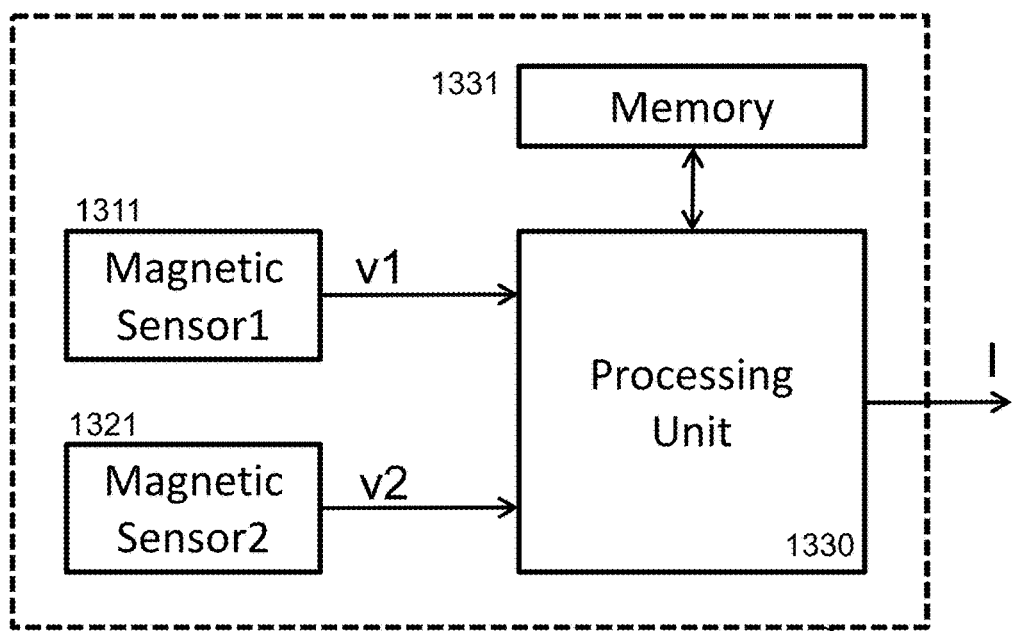
FIG. 13 shows an exemplary block-diagram of an electrical circuit which can be used in embodiments of the present invention.

FIG. 13 shows an electrical block-diagram of a circuit 1310 that can be used in a current sensor device 202. This block-diagram does not contain a temperature sensor or a stress sensor.

The processing unit 1330 is adapted for determining the current to be measured by calculating the current according to the formula: $I=K \cdot (v1-v2)$, where K is a predefined constant, which may be determined during design, by simulation, or during an evaluation or calibration phase), v1 is the value provided by the first magnetic sensor 1311 (or a value derived therefrom, e.g. after amplification), and v2 is the value provided by the second magnetic sensor 1321 (or a value derived therefrom). The subtraction may be done in hardware before amplification or after amplification or can be performed in the digital domain. The processing unit 1330 may comprise a digital processor comprising or connected to a non-volatile memory 1331 storing at least one constant value K.

While not explicitly shown, the processing circuit 1310 may comprise a differential amplifier configured for determining and amplifying a difference between the first value v1 and the second value v2, and for amplifying this difference in the analogue domain. Alternatively, the processing circuit 1310 may comprise an amplifier configured for selectively amplifying the first value v1 and the second value v2. The sensor device may further comprise an analog-to-digital convertor ADC configured for digitizing these amplified signals. The ADC may be part of a digital processor circuit.

The current to be measured may be provided as an analog output signal proportional to the current, or may be provided as a digital signal indicative of the current to be measured, for example via a digital data interface, for example a serial data bus (e.g. using the I2C protocol, or using RS232 protocol, or any other suitable protocol).

Figure 14:
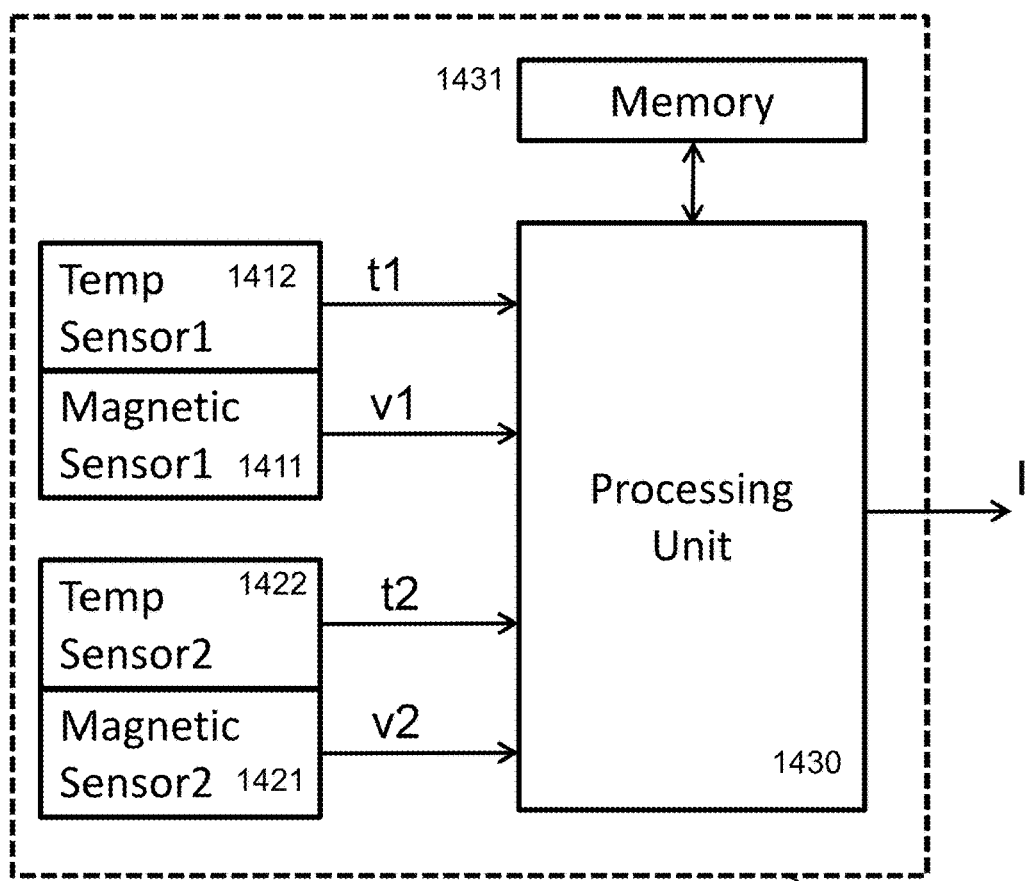
FIG. 14 shows an exemplary block-diagram of an electrical circuit which can be used in embodiments of the present invention.

FIG. 14 shows an electrical block-diagram of a processing circuit 1410 which can be seen as a variant of the processing circuit 1310 of FIG. 13, further comprising a first and/or a second temperature sensor 1412, 1422, communicatively connected to the processing unit 1430. The processing unit 1430 is adapted for determining the current to be measured based on the values v1 and v2 but taking into account one or both of the temperature signals t1, t2. The measured temperature(s) can be taken into account for compensating the measurement values v1, v2 for temperature variations, e.g. to compensate for sensitivity variations of the sensor elements. Such compensation techniques are known per se in the art, and hence need not be explained in more detail here.

In a particular embodiment, a temperature compensation is performed in a manner similar as described in EP3109658A1, which is incorporated herein by reference in its entirety.

It is an advantage of a current sensor that includes a temperature compensation mechanism. In this way, the accuracy of the current measurement can be further improved.

The processing unit 1330 of FIG. 13 and 1430 of FIG. 14 may contain a digital processor, for example a programmable microcontroller. Although not explicitly shown, the circuit 1310 and 1410 may also contain at least one analog-to-digital convertor, which may be part of the magnetic sensors, or may be part of the processing unit, or may be implemented as a separate circuit (e.g. between an output of the sensor circuit and an input of the processing unit). The block diagram of FIG. 13 and FIG. 14 does not show this level of detail, for the same reasons as it does not show a biasing circuit, a readout circuit, an optional amplifier, a power supply, etc., which are all well known in the art, and hence need not be described in detail here.

It is noted in this respect that if the signals v1, v2, t1 and t2 are analog signals, the processing unit 1430 may contain at least one ADC to convert these signals into digital signals, whereas in case the signals v1, v2, t1 and t2 are digital signals, the processing unit 1430 need not have an ADC.

It is an advantage of embodiments with two temperature sensors, one for each magnetic sensor, because the temperature of the first and second magnetic sensor may be substantially different, especially if a relatively high current is being measured in close vicinity of the busbar, because such a high current typically causes the busbar to warm up significantly, causing a relatively large temperature gradient over the substrate of the sensor device. In this way the accuracy of the current measurement can be further improved.

In a variant (not shown) of FIG. 14, the circuit comprises only one temperature sensor, which may be arranged for measuring the temperature of the first magnetic sensor, or for measuring the temperature of the second magnetic sensor. The temperature of the other magnetic sensor may then be estimated based on the estimated power dissipation (in turn based on v1 and v2) and based on an predefined assumption of the ambient temperature, instead of actually measuring the other temperature. Of course, an embodiment with two temperature sensors is more accurate.

In a variant (not shown) of FIG. 14, the circuit comprises one or two mechanical stress sensors instead of one or two temperature sensors, and the processing unit 1430 is adapted for determining the current based on the values obtained from the magnetic sensors, taking into account the stress value(s) obtained from one or both stress sensors.

In another variant (not shown) of FIG. 14, the circuit additionally comprises one or two stress sensors in addition to one or two temperature sensors, and the processing unit 1430 is adapted for determining the current based on the values obtained from the magnetic sensors and the one or more temperature sensors and the one or more stress sensors.

In an embodiment, each magnetic sensor element H1, H2 has an associated temperature sensor and an associated mechanical stress sensor, and the processing circuit is configured for measuring the two magnetic signals, and for measuring the two temperatures, and for measuring the two mechanical stress values, and is configured for determining $\Delta Bz=Bz1-Bz2$, and for multiplying the value $\Delta Bz$ by a predefined constant factor K (independent of frequency), and for compensating the result for temperature and/or mechanical stress, for example using a polynomial expression of the temperature and/or stress, for example in a manner as described in EP3109658(A1), incorporated herein by reference in its entirety.

In another embodiment, the sensor device comprises: a semiconductor substrate comprising a first and second magnetic sensor element H1, H2; a first and second biasing means (e.g. a first current source and a second current source) for biasing the first and second magnetic sensor element, one or both of which may be adjustable or configurable; a first and a second amplifier for amplifying the signals provided by the first and second magnetic sensor element (one or both of the amplifiers may have a configurable or adjustable gain); an analog-to-digital convertor (ADC) for digitizing the first and second sensor signal or a signal derived therefrom; and a processing circuit having an input connected to an output of the ADC. This sensor device further comprises at least one of: (i) a temperature sensor (e.g. a single temperature sensor) for measuring a temperature of the semiconductor substrate, and (ii) two mechanical stress sensors, or a differential stress sensor for measuring a differential stress exerted upon the first and second magnetic sensor. Various examples of hardware block-diagrams are shown in FIG. 3(*a*) to FIG. 5(*f*) of co-pending patent application EP20165059.5 filed on 23 Mar. 2020, and in co-pending patent application EP21161150.4 filed on 7 Mar. 2021 by the same applicant, both applications being incorporated herein by reference in their entirety. By combining the hardware and the biasing or correction methods described in EP20165059.5 or EP21161150.4 with the positioning of the sensor device relative to the busbar in one of the "sweet zones" or "regions" as described above, a current sensor system is provided for measuring an AC current, with high accuracy, and with a reduced influence of a strayfield.

The invention claimed is:

1. A current sensor system for measuring an AC electrical current, comprising:
   a busbar having a predefined thickness and a predefined width, and having a substantially rectangular cross section;
   a sensor device comprising two sensor elements spaced apart by a predefined distance along a first direction, each configured for measuring a magnetic field component oriented in a second direction; the sensor device being configured for determining a magnetic field difference or a magnetic field gradient along the first direction based on these magnetic field components, and for determining said AC current based on the magnetic field gradient or magnetic field difference;
   wherein the sensor device is positioned relative to the busbar such that a reference point of the sensor device situated in the middle between the two sensor elements is located at a first distance from a side of the busbar measured in the first direction, and is located at a second distance from the busbar measured in the second direction;
   wherein the first distance is a value in a range from 70% to 110% of the width of the busbar; and
   wherein the second predefined distance is a value in a range from 0.5 mm to 4.0 mm;
   wherein the sensor device is positioned relative to the busbar such that a ratio of the magnitude of the AC current and the magnitude of the magnetic field gradient is substantially constant within a predefined tolerance margin of ±3.0%, for AC currents having a frequency in a predefined frequency range comprising at least a range from 100 Hz to 2000 Hz.

2. The current sensor system according to claim 1, wherein the rectangular cross section of the busbar has a thickness in a range from 2.0 to 5.0 mm.

3. The current sensor system according to claim 1, wherein the rectangular cross section of the busbar has a width or an effective width in a range from 3.0 to 10.0 mm.

4. The current sensor system according to claim 1, wherein the two sensor elements are spaced apart by a distance in a range from 0.5 mm to 4.0 mm.

5. A current sensor system for measuring an AC electrical current, comprising:
   a busbar having a predefined thickness and a predefined width, and having a substantially rectangular cross section;
   a sensor device comprising two sensor elements spaced apart by a predefined distance along a first direction, each configured for measuring a magnetic field component oriented in a second direction; the sensor device being configured for determining a magnetic field difference or a magnetic field gradient along the first direction based on these magnetic field components, and for determining said AC current based on the magnetic field gradient or magnetic field difference;

wherein the sensor device is positioned relative to the busbar such that a reference point of the sensor device situated in the middle between the two sensor elements is located at a first distance from a side of the busbar measured in the first direction, and is located at a second distance from the busbar measured in the second direction;

wherein the first distance is a value in a range from 70% to 110% of the width of the busbar;

wherein the second predefined distance is a value in a range from 0.5 mm to 4.0 mm; and wherein the sensor device is positioned relative to the busbar such that a phase shift of the magnetic field difference or of the magnetic field gradient with respect to a phase of the AC current is substantially constant within a second predefined tolerance margin of ±3.0°, for AC currents having a frequency in a predefined frequency range comprising at least a range from 100 Hz to 2000 Hz.

6. The current sensor system according to claim 5, wherein the rectangular cross section of the busbar has a thickness in a range from 2.0 to 5.0 mm.

7. The current sensor system according to claim 5, wherein the rectangular cross section of the busbar has a width or an effective width in a range from 3.0 to 10.0 mm.

8. The current sensor system according to claim 5, wherein the two sensor elements are spaced apart by a distance in a range from 0.5 mm to 4.0 mm.

9. A current sensor system for measuring an AC electrical current, comprising:
  a busbar having a predefined thickness and a predefined width, and having a substantially rectangular cross section;
  a sensor device comprising two sensor elements spaced apart by a predefined distance along a first direction, each configured for measuring a magnetic field component oriented in a second direction; the sensor device being configured for determining a magnetic field difference or a magnetic field gradient along the first direction based on these magnetic field components, and for determining said AC current based on the magnetic field gradient or magnetic field difference;
  wherein the sensor device is positioned relative to the busbar such that a reference point of the sensor device situated in the middle between the two sensor elements is located at a first distance from a side of the busbar measured in the first direction, and is located at a second distance from the busbar measured in the second direction;
  wherein the first distance is a value in a range from 70% to 110% of the width of the busbar;
  wherein the second predefined distance is a value in a range from 0.5 mm to 4.0 mm; and
  wherein the sensor device is positioned relative to the busbar such that a real part of the first magnetic field component is substantially equal to a real part of the second magnetic field component within a predefined tolerance margin of ±3.0%, and such that an imaginary part of the first magnetic field component is substantially equal to an imaginary part of the second magnetic field component within said predefined tolerance margin, for AC currents having a frequency in a predefined frequency range comprising at least a range from 100 Hz to 2000 Hz.

10. The current sensor system according to claim 9, wherein the rectangular cross section of the busbar has a thickness in a range from 2.0 to 5.0 mm.

11. The current sensor system according to claim 9, wherein the rectangular cross section of the busbar has a width or an effective width in a range from 3.0 to 10.0 mm.

12. The current sensor system according to claim 9, wherein the two sensor elements are spaced apart by a distance in a range from 0.5 mm to 4.0 mm.

13. A current sensor system for measuring an AC electrical current, comprising:
  a busbar having a predefined thickness and a predefined width, and having a substantially rectangular cross section;
  a sensor device comprising two sensor elements spaced apart by a predefined distance along a first direction, each configured for measuring a magnetic field component oriented in a second direction; the sensor device being configured for determining a magnetic field difference or a magnetic field gradient along the first direction based on these magnetic field components, and for determining said AC current based on the magnetic field gradient or magnetic field difference;
  wherein the sensor device is positioned relative to the busbar such that a reference point of the sensor device situated in the middle between the two sensor elements is located at a first distance from a side of the busbar measured in the first direction, and is located at a second distance from the busbar measured in the second direction;
  wherein the first distance is a value in a range from 70% to 110% of the width of the busbar;
  wherein the second predefined distance is a value in a range from 0.5 mm to 4.0 mm;
  wherein the two sensor elements are two horizontal Hall elements; and
  wherein the two horizontal Hall elements are spaced apart by a distance in a range from 0.5 mm to 4.0 mm; and
  wherein the rectangular cross section of the busbar has a thickness in a range from 2.0 mm to 5.0 mm and a width in a range from 3.0 mm to 10 mm; and
  wherein the reference point is located in one or more of the following zones:
   i) in a predefined zone where the first predefined distance is a value in a range from 70% to 95% of the width of the busbar, and the second predefined distance is a value from 0.5 to 4.0 mm; or
   ii) in a predefined zone where the first predefined distance is a value in a range from 70% to 82% of the width, and the second predefined distance is a value from 0.5 to 1.5 mm; or
   iii) in a predefined zone where the first predefined distance is a value in a range from 72% to 87% of the width, and the second predefined distance is a value from 1.5 to 2.5 mm; or
   iv) in a predefined zone where the first predefined distance is a value in a range from 77% to 95% of the width, and the second predefined distance is a value from 2.5 to 4.0 mm.

14. The current sensor system according to claim 13, wherein the reference point is located in one or more of the following zones:
   i) in a predefined zone where the first predefined distance is a value in a range from 70% to 95% of the width of the busbar, and the second predefined distance is a value from 1.0 to 3.5 mm; or ii) in a predefined zone where the first predefined distance is a value in a range from 70% to 82% of the width, and the second predefined distance is a value from 1.0 to 1.5 mm; or iii) in a predefined zone where the first predefined distance is a value in a range from 72% to 87% of the width, and the second predefined distance is a value from 1.5 to 2.5 mm; or iv) in a predefined zone where the first predefined distance is a value in a range from 77% to 95% of the width, and the second predefined distance is a value from 2.5 to 3.5 mm.

15. The current sensor system according to claim 13,
wherein the reference point is located in one or more of the following zones:
   i) in a predefined zone where the first predefined distance is a value in a range from 74% to 88% of the width of the busbar, and the second predefined distance is a value from 1.0 to 3.3 mm; or
   ii) in a predefined zone where the first predefined distance is a value in a range from 74% to 81% of the width, and the second predefined distance is a value from 1.0 to 2.0 mm; or
   iii) in a predefined zone where the first predefined distance is a value in a range from 75% to 86% of the width, and the second predefined distance is a value from 2.0 to 2.5 mm; or
   iv) in a predefined zone where the first predefined distance is a value in a range from 77% to 88% of the width, and the second predefined distance is a value from 2.5 to 3.3 mm.

16. A current sensor system for measuring an AC electrical current, comprising:
   a busbar having a predefined thickness and a predefined width, and having a substantially rectangular cross section;
   a sensor device comprising two sensor elements spaced apart by a predefined distance along a first direction, each configured for measuring a magnetic field component oriented in a second direction; the sensor device being configured for determining a magnetic field difference or a magnetic field gradient along the first direction based on these magnetic field components, and for determining said AC current based on the magnetic field gradient or magnetic field difference;
   wherein the sensor device is positioned relative to the busbar such that a reference point of the sensor device situated in the middle between the two sensor elements is located at a first distance from a side of the busbar measured in the first direction, and is located at a second distance from the busbar measured in the second direction;
   wherein the first distance is a value in a range from 70% to 110% of the width of the busbar;
   wherein the second predefined distance is a value in a range from 0.5 mm to 4.0 mm;
   wherein the two sensor elements are two horizontal Hall elements and wherein the two horizontal Hall elements are spaced apart by a distance in a range from 0.5 mm to 4.0 mm; and
   wherein the rectangular cross section of the busbar has a thickness in a range from 2.0 mm to 5.0 mm and a width in a range from 3.0 mm to 10.0 mm; and
   wherein the reference point is located in one or more of the following zones:
   i) in a predefined zone having a trapezoidal shape in a cross-sectional plane defined by interconnecting the following four points by straight lines: (ds=80%, Zs=4.0 mm), (ds=110%, Zs=4.0 mm), (ds=85%, Zs=2.0);
   ii) in a predefined zone having a shape in a cross-sectional plane defined by interconnecting the following five points by straight lines: (ds=80%, Zs=4.0 mm), (ds=98%, Zs=4.0 mm), (ds=98%, Zs=3.0 mm), (ds=85%, Zs=2.0 mm), (ds=75%, Zs=2.0 mm);
   iii) in a predefined zone having a trapezoidal shape in a cross-sectional plane defined by interconnecting the following four points by straight lines: (ds=70%, Zs=0.0 mm), (ds=75%, Zs=2.0 mm), (ds=85%, Zs=2.0 mm), (ds=85%, Zs=0.0 mm);
   where ds is the first distance, and Zs is the second distance.

17. A method of measuring an AC electrical current having a frequency in a predefined frequency range, using a current sensor system,
the method comprising the steps of:
   a) measuring, by the sensor device, a first and a second magnetic field component oriented in the second direction at two different locations spaced apart along the first direction;
   b) determining a difference of these magnetic field components;
   c) determining said AC current based on said difference;
   wherein the current sensor system comprises:
      a busbar having a predefined thickness and a predefined width, and having a substantially rectangular cross section;
      a sensor device comprising two sensor elements spaced apart by a predefined distance along a first direction, each configured for measuring a magnetic field component oriented in a second direction; the sensor device being configured for determining a magnetic field difference or a magnetic field gradient along the first direction based on these magnetic field components, and for determining said AC current based on the magnetic field gradient or magnetic field difference;
   wherein the sensor device is positioned relative to the busbar such that a reference point of the sensor device situated in the middle between the two sensor elements is located at a first distance from a side of the busbar measured in the first direction, and is located at a second distance from the busbar measured in the second direction;
   wherein the first distance is a value in a range from 70% to 110% of the width of the busbar; and
   wherein the second predefined distance is a value in a range from 0.5 mm to 4.0 mm.

18. The method according to claim 17,
   wherein the method further comprises step d) of measuring a temperature of one or both sensor elements and/or measuring a mechanical stress exerted upon one or both sensor elements; and
   wherein step c) comprises:
      determining said AC current based on the magnetic field gradient and based on one or both of said temperature and said mechanical stress.

19. The method according to claim 17, wherein the sensor device further comprises a semiconductor substrate comprising the first and second magnetic sensor element, a first and second biasing means for biasing the first and second magnetic sensor element, a first and a second amplifier for amplifying the first and second sensor signal provided by the first and second magnetic sensor element, an analog-todigital convertor for digitizing the first and second sensor signal or a signal derived therefrom; and at least one of: (i) a temperature sensor for measuring a temperature of the semiconductor substrate, and (ii) a differential stress sensor for measuring a differential stress exerted upon the first and second magnetic sensor; and a processing means having an input port connected to an output of the ADC; and wherein the method further comprises step d) of measuring a temperature and/or measuring a mechanical differential stress; and wherein the method further comprises the step of:

adjusting a biasing signal and/or adjusting an amplifier gain and/or adjusting a digital value of the amplified second sensor signal, based on a predefined function of the measured temperature and/or the measured differential stress, before determining a difference between:

a first signal or a first value derived from the first sensor signal, and a second signal or a second value derived from the second sensor signal.

* * * * *